United States Patent
Hoffman et al.

(10) Patent No.: US 7,141,757 B2
(45) Date of Patent: Nov. 28, 2006

(54) PLASMA REACTOR WITH OVERHEAD RF SOURCE POWER ELECTRODE HAVING A RESONANCE THAT IS VIRTUALLY PRESSURE INDEPENDENT

(75) Inventors: Daniel Hoffman, Saratoga, CA (US); Jang Gyoo Yang, Sunnyvale, CA (US); Douglas A. Buchberger, Jr., Livermore, CA (US); Douglas Burns, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 490 days.

(21) Appl. No.: 10/778,620

(22) Filed: Feb. 13, 2004

(65) Prior Publication Data

US 2004/0159287 A1    Aug. 19, 2004

Related U.S. Application Data

(63) Continuation-in-part of application No. 10/235,988, filed on Sep. 4, 2002, now Pat. No. 6,900,596, which is a continuation-in-part of application No. 10/192,271, filed on Jul. 9, 2002, now Pat. No. 6,853,141, said application No. 10/778,620 is a continuation-in-part of application No. 10/288,890, filed on Nov. 5, 2002, now Pat. No. 6,838,635, which is a continuation-in-part of application No. 09/527,342, filed on Mar. 17, 2000, now Pat. No. 6,528,751.

(51) Int. Cl.
 *B23K 10/00* (2006.01)
(52) U.S. Cl. .................... 219/121.43; 219/121.41; 219/121.4; 156/345.44; 156/345.47; 118/723 I

(58) Field of Classification Search ............ 219/121.4, 219/121.41, 121.43, 121.57, 121.59; 156/345.43, 156/345.44, 345.47; 315/111.21, 111.51; 118/723 I, 723 R
See application file for complete search history.

(56) References Cited

U.S. PATENT DOCUMENTS

| | | | |
|---|---|---|---|
| 2,951,960 A | 9/1960 | Watrous, Jr. | 313/36 |
| 2,967,926 A | 1/1961 | Edstrom | 219/75 |
| 3,355,615 A | 11/1967 | Le Bihan et al. | 313/363.1 |
| 3,610,986 A | 10/1971 | King | 313/63 |
| 4,458,180 A | 7/1984 | Sohval | 315/111.81 |

(Continued)

FOREIGN PATENT DOCUMENTS

EP    0 343 500    11/1989

(Continued)

OTHER PUBLICATIONS

King, Ronald W.P., "Transmission-Line Theory", McGraw-Hill Book Company, 1955, pp. 1-10 and 282-286, USA.

(Continued)

*Primary Examiner*—Mark Paschall
(74) *Attorney, Agent, or Firm*—Robert M. Wallace

(57) ABSTRACT

A plasma reactor operable over a very wide process window of pressure, source power and bias power includes a resonant circuit consisting of an overhead electrode having a first impedance, a wafer support pedestal having a second impedance and a bulk plasma having a third impedance and generally lying in a process zone between the overhead electrode and the wafer support pedestal, the magnitudes of the impedances of the overhead electrode and the wafer support pedestal being within an order of magnitude of one another, the resonant circuit having a resonant frequency determined by the first, second and third impedances.

22 Claims, 18 Drawing Sheets

U.S. PATENT DOCUMENTS

| | | | | |
|---|---|---|---|---|
| 4,464,223 A | 8/1984 | Gorin | | 156/643 |
| 4,570,106 A | 2/1986 | Sohval et al. | | 315/111.81 |
| 4,579,618 A | 4/1986 | Celestino et al. | | 156/345 |
| 4,859,908 A | 8/1989 | Yoshida et al. | | 315/111.81 |
| 4,888,518 A | 12/1989 | Grunwald | | 313/40 |
| 4,973,883 A | 11/1990 | Hirose et al. | | 315/111.41 |
| 4,990,229 A | 2/1991 | Campbell et al. | | 204/298.06 |
| 5,006,760 A | 4/1991 | Drake, Jr. | | 315/111.21 |
| 5,017,835 A | 5/1991 | Oechsner | | 315/111.81 |
| 5,032,202 A | 7/1991 | Tsai et al. | | 156/345 |
| 5,053,678 A | 10/1991 | Koike et al. | | 315/111.81 |
| 5,055,853 A | 10/1991 | Garnier | | 343/769 |
| 5,077,499 A | 12/1991 | Oku | | 315/111.21 |
| 5,089,083 A | 2/1992 | Kojima et al. | | 156/643 |
| 5,107,170 A | 4/1992 | Ishikawa et al. | | 313/362.1 |
| 5,115,167 A | 5/1992 | Ootera et al. | | 315/111.21 |
| 5,122,251 A | 6/1992 | Campbell et al. | | 204/298.06 |
| 5,140,223 A | 8/1992 | Gesche et al. | | 315/111.21 |
| 5,175,472 A | 12/1992 | Johnson, Jr. et al. | | 315/111.21 |
| 5,195,045 A | 3/1993 | Keane et al. | | 364/482 |
| 5,198,725 A | 3/1993 | Chen et al. | | 315/111.41 |
| 5,210,466 A | 5/1993 | Collins et al. | | |
| 5,213,658 A | 5/1993 | Ishida | | 156/643 |
| 5,218,271 A | 6/1993 | Egorov et al. | | 315/111.61 |
| 5,223,457 A | 6/1993 | Mintz et al. | | 437/225 |
| 5,225,024 A | 7/1993 | Hanley et al. | | 156/345 |
| 5,246,532 A | 9/1993 | Ishida | | 156/345 |
| 5,256,931 A | 10/1993 | Bernadet | | 313/360.1 |
| 5,272,417 A | 12/1993 | Ohmi | | 315/111.21 |
| 5,273,610 A | 12/1993 | Thomas, III et al. | | 156/627 |
| 5,274,306 A | 12/1993 | Kaufman et al. | | 315/111.41 |
| 5,279,669 A | 1/1994 | Lee | | 118/723 |
| 5,280,219 A | 1/1994 | Ghanbari | | 315/111.41 |
| 5,300,460 A | 4/1994 | Collins et al. | | 437/225 |
| 5,314,603 A | 5/1994 | Sugiyama et al. | | 204/298.32 |
| 5,325,019 A | 6/1994 | Miller et al. | | 315/111.21 |
| 5,401,351 A | 3/1995 | Samukawa | | 156/345 |
| 5,432,315 A | 7/1995 | Kaji et al. | | 219/121.43 |
| 5,453,305 A | 9/1995 | Lee | | 427/562 |
| 5,463,525 A | 10/1995 | Barnes et al. | | 361/234 |
| 5,467,013 A | 11/1995 | Williams et al. | | 324/127 |
| 5,474,648 A | 12/1995 | Patrick et al. | | 156/627.1 |
| 5,512,130 A | 4/1996 | Barna et al. | | 156/651.1 |
| 5,534,070 A | 7/1996 | Okamura et al. | | 118/723 |
| 5,537,004 A | 7/1996 | Imahashi et al. | | 315/111.21 |
| 5,554,223 A | 9/1996 | Imahashi | | 118/723 |
| 5,556,549 A | 9/1996 | Patrick et al. | | 216/61 |
| 5,567,268 A | 10/1996 | Kadomura | | 156/345 |
| 5,576,600 A | 11/1996 | McCrary et al. | | 315/111.81 |
| 5,576,629 A | 11/1996 | Turner et al. | | 324/709 |
| 5,587,038 A | 12/1996 | Cecchi et al. | | 156/345 |
| 5,592,055 A | 1/1997 | Capacci et al. | | 315/111.21 |
| 5,595,627 A | 1/1997 | Inazawa et al. | | 156/643.1 |
| 5,605,637 A | 2/1997 | Shan et al. | | 216/71 |
| 5,618,382 A | 4/1997 | Mintz et al. | | 216/64 |
| 5,627,435 A | 5/1997 | Jansen et al. | | 315/111.21 |
| 5,660,671 A | 8/1997 | Harada et al. | | 156/345 |
| 5,662,770 A | 9/1997 | Donohoe | | 438/716 |
| 5,674,321 A | 10/1997 | Pu et al. | | 118/723 |
| 5,685,914 A | 11/1997 | Hills et al. | | 118/723 |
| 5,705,019 A | 1/1998 | Yamada et al. | | 156/345 |
| 5,707,486 A | 1/1998 | Collins | | 156/643.1 |
| 5,710,486 A | 1/1998 | Ye et al. | | 315/111.21 |
| 5,720,826 A | 2/1998 | Hayashi et al. | | 136/249 |
| 5,733,511 A | 3/1998 | De Francesco | | 422/186.05 |
| 5,770,922 A | 6/1998 | Gerrish et al. | | 315/111.21 |
| 5,792,376 A | 8/1998 | Kanai et al. | | 216/71 |
| 5,846,885 A | 12/1998 | Kamata et al. | | 438/729 |
| 5,849,136 A | 12/1998 | Mintz et al. | | 156/345 |
| 5,849,372 A | 12/1998 | Annaratone et al. | | 427/569 |
| 5,855,685 A | 1/1999 | Tobe et al. | | 118/723 |
| 5,858,819 A | 1/1999 | Miyasaka | | 438/149 |
| 5,863,376 A | 1/1999 | Wicker et al. | | 156/345 |
| 5,866,986 A | 2/1999 | Pennington | | 315/111.21 |
| 5,868,848 A | 2/1999 | Tsukamoto | | 118/723 |
| 5,885,358 A | 3/1999 | Maydan et al. | | 118/723 |
| 5,904,799 A | 5/1999 | Donohoe | | 156/345 |
| 5,914,568 A | 6/1999 | Nonaka | | 315/111.21 |
| 5,929,717 A | 7/1999 | Richardson et al. | | 333/17.3 |
| 5,936,481 A | 8/1999 | Fujii | | 333/17.3 |
| 5,939,886 A | 8/1999 | Turner et al. | | 324/464 |
| 5,942,074 A | 8/1999 | Lenz et al. | | 156/345 |
| 5,971,591 A | 10/1999 | Vona et al. | | 364/478.08 |
| 5,997,962 A | 12/1999 | Ogasawara et al. | | 427/535 |
| 6,016,131 A | 1/2000 | Sato et al. | | 343/895 |
| 6,043,608 A | 3/2000 | Samukawa et al. | | 315/111.51 |
| 6,089,182 A | 7/2000 | Hama | | 118/723 |
| 6,093,457 A | 7/2000 | Okumura et al. | | 427/569 |
| 6,095,084 A | 8/2000 | Shamouilian et al. | | 118/723 E |
| 6,096,160 A | 8/2000 | Kadomura | | 156/345 |
| 6,106,663 A | 8/2000 | Kuthi et al. | | 156/345 |
| 6,110,395 A | 8/2000 | Gibson, Jr. | | 216/67 |
| 6,113,731 A | 9/2000 | Shan et al. | | 156/345 |
| 6,142,096 A | 11/2000 | Sakai et al. | | 118/723 |
| 6,152,071 A | 11/2000 | Akiyama et al. | | 118/723 |
| 6,155,200 A | 12/2000 | Horijke et al. | | 118/723 |
| 6,162,709 A | 12/2000 | Raoux et al. | | 438/513 |
| 6,174,450 B1 | 1/2001 | Patrick et al. | | 216/61 |
| 6,188,564 B1 | 2/2001 | Hao | | 361/234 |
| 6,213,050 B1 | 4/2001 | Liu et al. | | 118/723 |
| 6,218,312 B1 | 4/2001 | Collins et al. | | 438/723 |
| 6,245,190 B1 | 6/2001 | Masuda et al. | | 156/345 |
| 6,251,216 B1 | 6/2001 | Okamura et al. | | 156/345 |
| 6,262,538 B1 | 7/2001 | Keller | | 315/111.21 |
| 6,290,806 B1 | 9/2001 | Donohoe | | 156/345 |
| 6,291,999 B1 | 9/2001 | Nishimori et al. | | 324/464 |
| 6,337,292 B1 | 1/2002 | Kim et al. | | 438/787 |
| 6,346,915 B1 | 2/2002 | Okumura et al. | | 343/701 |
| RE37,580 E | 3/2002 | Barnes et al. | | 361/234 |
| 6,449,568 B1 | 9/2002 | Gerrish | | 702/60 |
| 6,451,703 B1 | 9/2002 | Liu et al. | | 438/710 |
| 6,462,481 B1 | 10/2002 | Holland et al. | | 315/111.21 |
| 6,528,751 B1 | 3/2003 | Hoffman et al. | | 219/121.43 |
| 6,586,886 B1 | 7/2003 | Katz et al. | | 315/111.21 |
| 6,894,245 B1 | 5/2005 | Hoffman et al. | | 219/121.43 |
| 2002/0139477 A1 | 10/2002 | Ni et al. | | 156/345.44 |
| 2003/0132195 A1 | 7/2003 | Edamura et al. | | 216/59 |
| 2003/0168427 A1 | 9/2003 | Flamm et al. | | 216/2 |

FOREIGN PATENT DOCUMENTS

| | | |
|---|---|---|
| EP | 0 678 903 | 10/1995 |
| EP | 0 719 447 | 7/1998 |
| WO | WO 01/71765 | 9/2001 |

OTHER PUBLICATIONS

U.S. Appl. No. 10/007,367, filed Oct. 22, 2001, entitled, "Merie Plasma Reactor with Overhead RF Electrode Tuned to the Plasma with Arcing Suppression", by Daniel Hoffman, et al.

U.S. Appl. No. 10/028,922, filed Dec. 19, 2002, entitled, "Plasma Reactor with Overhead RF Electrode Tuned to the Plasma with Arcing Suppression", by Daniel Hoffman et al.

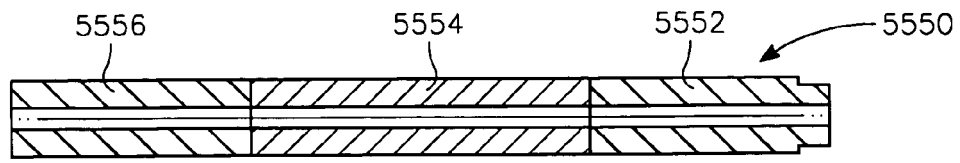
FIG. 10
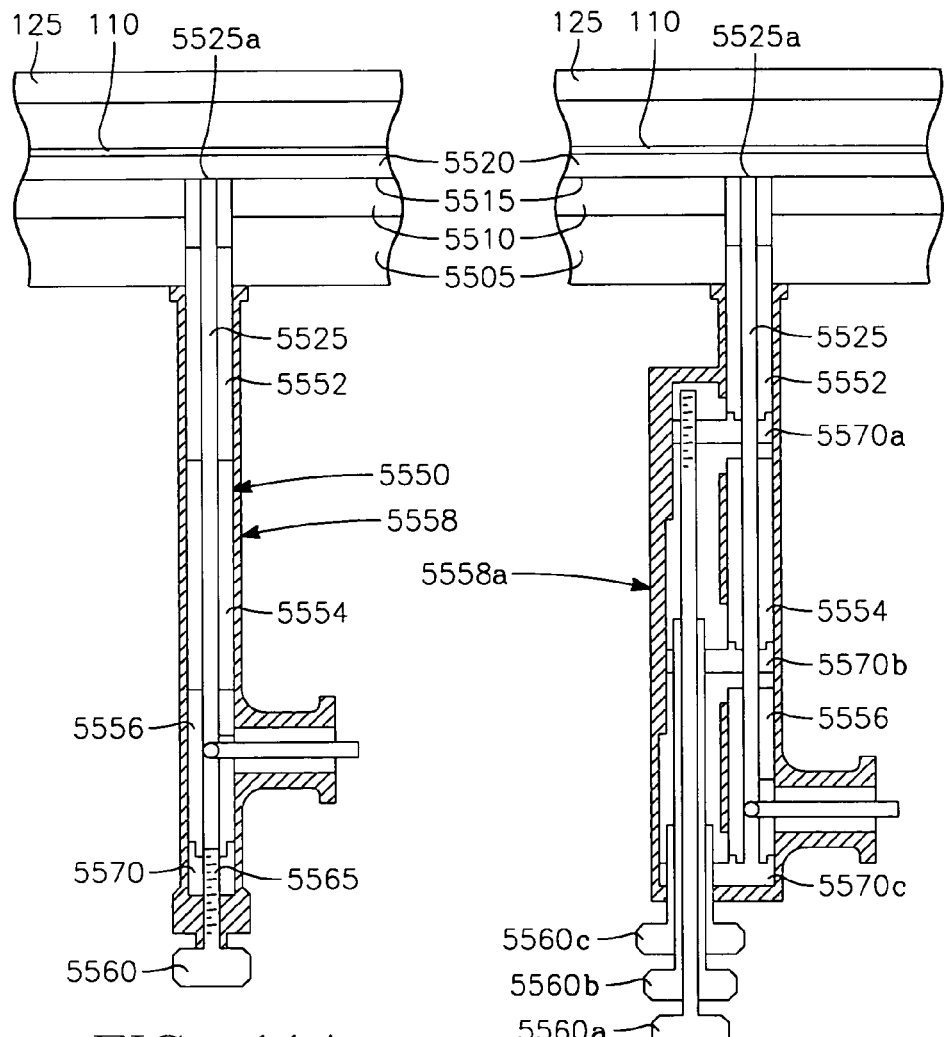
FIG. 11A
FIG. 11B

PLASMA REACTOR WITH OVERHEAD RF SOURCE POWER ELECTRODE HAVING A RESONANCE THAT IS VIRTUALLY PRESSURE INDEPENDENT

CROSS-REFERENCE TO RELATED APPLICATIONS

This application is a continuation-in-part of U.S. patent application Ser. No. 10/235,988 filed Sep. 4, 2002 now U.S. Pat. No. 6,900,596 entitled CAPACITIVELY COUPLED PLASMA REACTOR WITH UNIFORM RADIAL DISTRIBUTION OF PLASMA, by Jang Gyoo Yang et al., which is a continuation-in-part of U.S. patent application Ser. No. 10/192,271 filed Jul. 9, 2002 now U.S. Pat. No. 6,853,141 entitled CAPACITIVELY COUPLED PLASMA REACTOR WITH MAGNETIC CONTROL by Daniel Hoffman et al.

This application is also a continuation-in-part of U.S. patent application Ser. No. 10/288,890 filed Nov. 5, 2002 now U.S. Pat. No. 6,838,635 entitled PLASMA REACTOR WITH OVERHEAD RF ELECTRODE TUNED TO THE PLASMA by Daniel Hoffman, which is a continuation of U.S. patent application Ser. No. 09/527,342 filed Mar. 17, 2000 now U.S. Pat. No. 6,528,751 entitled PLASMA REACTOR WITH OVERHEAD RF ELECTRODE TUNED TO THE PLASMA by Daniel Hoffman.

This application also contains subject matter related to the following applications: U.S. patent application Ser. No. 10/754,280 filed Jan. 8, 2004 by Daniel J. Hoffman et al, entitled PLASMA REACTOR WITH OVERHEAD RF SOURCE POWER ELECTRODE WITH LOW LOSS, LOW ARCING TENDENCY AND LOW CONTAMINATION, which is a continuation-in-part of U.S. application Ser. No. 10/028,922, which is a continuation-in-part of U.S. application Ser. No. 09/527,342 filed Mar. 17, 2000; U.S. patent application Ser. No. 09/527,342 filed Mar. 17, 2000 entitled PLASMA REACTOR WITH OVERHEAD RF ELECTRODE TUNED TO THE PLASMA by Daniel Hoffman et al.; U.S. patent application Ser. No. 10/007,367 filed Oct. 22, 2001 entitled MERIE PLASMA REACTOR WITH OVERHEAD RF ELECTRODE TUNED TO THE PLASMA WITH ARCING SUPPRESSION by Daniel Hoffman et al., which is a continuation-in-part of U.S. patent application Ser. No. 09/527,342 filed Mar. 17, 2000; and U.S. patent application Ser. No. 10/028,922 filed Dec. 19, 2001 entitled PLASMA REACTOR WITH OVERHEAD RF ELECTRODE TUNED TO THE PLASMA WITH ARCING SUPPRESSION by Daniel Hoffman et al., which is a continuation-in-part of U.S. patent application Ser. No. 09/527,342 filed Mar. 17, 2000.

BACKGROUND OF THE INVENTION

Plasma processing of semiconductor wafers in the manufacture of microelectronic integrated circuits is used in dielectric etching, metal etching, chemical vapor deposition and other processes. Such plasma processes require precise control of process parameters, such as the amount of plasma power delivered to the plasma, for example. This parameter is affected by a number of variables, including the ability of the impedance matching device between the plasma source power generator and the reactor's RF power applicator to provide an impedance match over a widely varying plasma load impedance. The wide range of plasma load impedance is attributable to changing conditions within the reactor chamber. As described in U.S. Pat. No. 6,528,751 referenced above, this problem is addressed by a fixed impedance match device, such as a coaxial tuning stub or a strip line circuit, that couples source power to the ceiling electrode and has a wide match space. As described in the referenced patent, the reactance of the electrode is selected so that the electrode and plasma resonate at a plasma electrode resonant frequency. Further, the resonant frequency of the fixed match device, the electrode-plasma resonance and the source power frequency are all nearly equal and lie in the VHF range. One advantage is that the fixed match device has a very wide match space, so that the system is less sensitive to variations in plasma load impedance (so that such variations do not greatly affect the amount of source power delivered to the plasma). Even greater imperviousness to variations in plasma load impedance is obtained by providing a slight deviation between these three frequencies, as described in the above-referenced patent.

A problem limiting the process window of such a reactor is that the electrode-plasma resonance frequency varies widely with chamber pressure. What is desired is a plasma reactor that can perform a process, such as a reactive ion etch process, over a wide process window, including a wide range of chamber pressures from about 5 mT to about 1000 mT. The problem is that such a wide variation in pressure creates changes in the plasma-electrode resonant frequency that cause an impedance mismatch and consequent loss of control over delivered plasma source power. As described below in the detailed description, the fixed impedance match (i.e., the coaxial tuning stub) has a wide impedance match space provided that the plasma-electrode resonant frequency does not deviate too far from the source power frequency. In general, the fixed impedance match need only hold the VSWR at the source power generator within 3:1 to provide an adequate match. What we have found is that as chamber pressure is varied from 5 mT to 1000 mT, the VSWR exceeds 3:1 over a portion of this range. Thus, the chamber pressure must be confined within a much smaller range.

We have found that the variation in plasma-electrode resonant frequency with chamber pressure seems to be unavoidable: The resonant frequency is a function of the plasma impedance which in turn depends upon the electron-neutral collision frequency. The electron-neutral collision frequency is a direct function of chamber pressure. Thus, a variation in plasma-electrode resonant frequency with chamber pressure would appear to be unavoidable, so that realizing a wide pressure window (e.g., 5–1000 mT) has not seemed an attainable goal.

SUMMARY OF THE INVENTION

A plasma reactor operable over a very wide process window of pressure, source power and bias power includes a resonant circuit consisting of an overhead electrode having a first impedance, a wafer support pedestal having a second impedance and a bulk plasma having a third impedance and generally lying in a process zone between the overhead electrode and the wafer support pedestal, the magnitudes of the impedances of the overhead electrode and the wafer support pedestal being within an order of magnitude of one another, the resonant circuit having a resonant frequency determined by the first, second and third impedances. An RF plasma source power generator having a frequency at least nearly matching the resonant frequency is coupled to the overhead electrode by a fixed impedance match element.

In one aspect, the magnitudes of the impedances of the overhead electrode and the wafer support pedestal are within a factor of two of one another. In a further aspect, an RF plasma bias power generator is coupled to the pedestal through an impedance match circuit. In a yet further aspect, the fixed impedance match element has its own resonance nearly matching the resonant frequency of resonant circuit.

The impedance of said bulk plasma is susceptible to changes with gas pressure inside said reactor, and the impedance of the wafer support pedestal near the resonant frequency is can be sufficient to maintain a VSWR for the RF plasma source power generator not exceeding 3:1 for changes in chamber pressure from 10 mT to 900 mT.

In one embodiment, the wafer support pedestal includes a conductive RF feed layer and a grounded base layer separated from the conductive RF feed layer across a dielectric gap to form a cathode capacitor across the dielectric gap. The length of the gap is sufficient to provide the necessary cathode impedance to achieve the large process window or chamber pressure range.

BRIEF DESCRIPTION OF THE DRAWINGS

FIG. 10 is a cut-away side view of the dielectric sleeve.

FIG. 11A is a side view illustrating a version of the dielectric sleeve that is mechanically adjustable.

FIG. 11B is a side view illustrating a version having multiple sleeve sections that are each mechanically adjustable.

FIG. 19 illustrates a plasma reactor corresponding to FIG. 7 with uniform capacitance across the cathode having a relatively large cathode impedance at the source power frequency.

FIGS. 25, 26 and 27 are contemporaneous timing diagrams illustrating an operative sequence in which the reactor of FIG. 19 transitions successively to the eight corners of the 3-dimensional process window of FIG. 24 without extinguishing the plasma, of which FIG. 25 illustrates plasma emission (density) as a function of time, FIG. 26 illustrates RF bias voltage as a function of time and FIG. 27 illustrates the corresponding selection of source power, bias power and chamber pressure as a function of time.

DETAILED DESCRIPTION OF THE INVENTION

Figure 1:
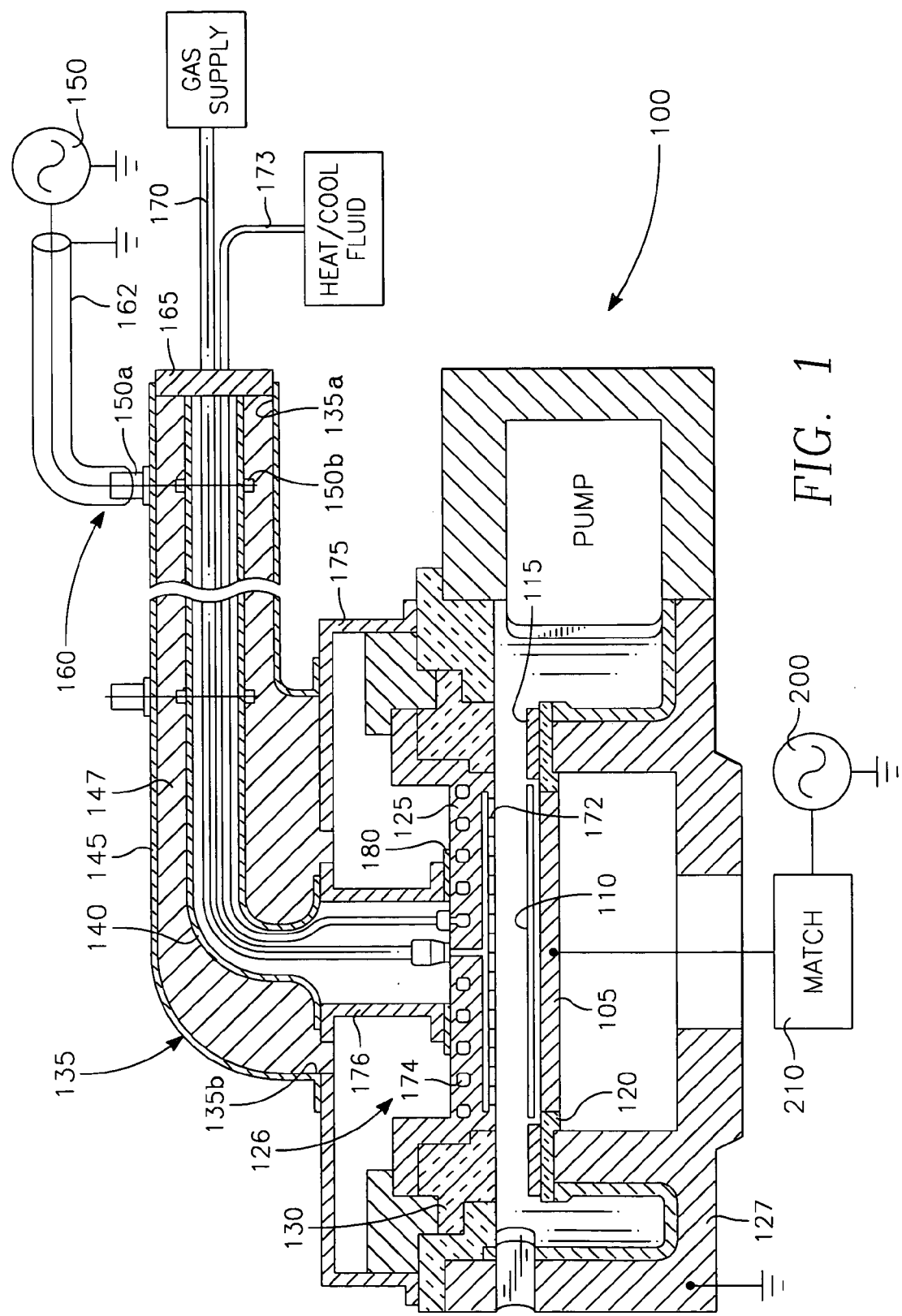
FIG. 1 is a cut-away cross-sectional side view of a plasma reactor.

Referring to FIG. 1, a plasma reactor includes a reactor chamber 100 with a wafer support 105 at the bottom of the chamber supporting a semiconductor wafer 110. A semiconductor ring 115 surrounds the wafer 110. The semiconductor ring 115 is supported on the grounded chamber body 127 by a dielectric (quartz) ring 120. In one embodiment, this is of a thickness of 10 mm and dielectric constant of 4. The chamber 100 is bounded at the top by a disc shaped overhead aluminum electrode 125 supported at a predetermined gap length above the wafer 110 on grounded chamber body 127 by a dielectric (quartz) seal 130. The overhead electrode 125 also may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, resonance frequency, and provides an impedance match between the electrode 125 and the 50 Ohm coaxial cable 162 or the 50 Ohm output of the RF power generator 150, as will be more fully described below. The chamber body is connected to the RF return (RF ground) of the RF generator 150. The RF path from the overhead electrode 125 to RF ground is affected by the capacitance of the semiconductor ring 115, the dielectric ring 120 and the dielectric seal 130. The wafer support 105, the wafer 110 and the semiconductor ring 115 provide the primary RF return path for RF power applied to the electrode 125.

The capacitance of the overhead electrode assembly 126, including the electrode 125, the dielectric ring 120 and dielectric seal 130 measured with respect to RF return or ground can be 180 pico farads. The electrode assembly capacitance is affected by the electrode area, the gap length (distance between wafer support and overhead electrode), and by factors affecting stray capacitances, especially the dielectric values of the seal 130 and of the dielectric ring 120, which in turn are affected by the dielectric constants and thicknesses of the materials employed. More generally, the capacitance of the electrode assembly (an unsigned number or scalar) is equal or nearly equal in magnitude to the negative capacitance of the plasma (a complex number) at a particular source power frequency, plasma density and operating pressure, as will be discussed below.

Many of the factors influencing the foregoing relationship are in great part predetermined due to the realities of the plasma process requirements needed to be performed by the reactor, the size of the wafer, and the requirement that the processing be carried out uniformly over the wafer. Thus, the plasma capacitance is a function of the plasma density and the source power frequency, while the electrode capacitance is a function of the wafer support-to-electrode gap (height), electrode diameter, and dielectric values of the insulators of the assembly. Plasma density, operating pressure, gap, and electrode diameter must satisfy the requirements of the plasma process to be performed by the reactor. In particular, the ion density must be within a certain range. For example, silicon and dielectric plasma etch processes generally require the plasma ion density to be within the range of $10^9$ to $10^{12}$ ions/cc. The wafer electrode gap provides an optimum plasma ion distribution uniformity for 8 inch wafers, for example, if the gap is about 1.25 to about 2.0 inches. For 300 mm diameter wafers, an optimum gap size is about 1.25 inches. The electrode diameter can be at least as great as, if not greater than the diameter of the wafer. Operating pressures similarly have practical ranges for typical etch and other plasma processes.

But it has been found that other factors remain which can be selected to achieve the above relationship, particularly choice of source frequency and choice of capacitances for the overhead electrode assembly 126. Within the foregoing dimensional constraints imposed on the electrode and the constraints (e.g., density range) imposed on the plasma, the electrode capacitance can be matched to the magnitude of the negative capacitance of the plasma if the source power frequency is selected to be a VHF frequency, and if the dielectric values of the insulator components of electrode assembly 126 are selected properly. Such selection can achieve a match or near match between source power frequency and plasma-electrode resonance frequency.

Accordingly in one aspect, for an 8-inch wafer the overhead electrode diameter is approximately 11 inches, the gap is about 2 inches, the plasma density and operating pressure is typical for etch processes as above-stated, the dielectric material for the seal 130 has a dielectric constant of 9 and a thickness of the order of 1 inch, the ring 115 has an inner diameter of slightly in excess of 10 inches and an outer diameter of about 13 inches, the ring 120 has a dielectric constant of 4 and a thickness of the order of 10 mm, the VHF source power frequency is 210 MHz (although other VHF frequencies could be equally effective), and the source power frequency, the plasma electrode resonance frequency and the stub resonance frequency are all matched or nearly matched. For 300 mm diameter wafers, an optimum source power frequency is 162 MHz, with the plasma electrode resonance frequency and the stub resonance frequency being matched or slightly offset from 162 MHz.

More particularly, these three frequencies can be slightly offset from one another, with the source power frequency being 162 MHz (optimized for 300 mm wafers), the electrode-plasma resonant frequency being slightly below 162 MHz, and the stub frequency being slightly above 162 MHz, in order to achieve a de-tuning effect which advantageously reduces the system Q. Such a reduction in system Q renders the reactor performance less susceptible to changes in conditions inside the chamber, so that the entire process is much more stable and can be carried out over a far wider process window.

The coaxial stub 135 is a specially configured design which further contributes to the overall system stability, its wide process window capabilities, as well as many other valuable advantages. It includes an inner cylindrical conductor 140 and an outer concentric cylindrical conductor 145. An insulator 147 (denoted by cross-hatching in FIG. 1) having, for example, a relative dielectric constant of 1 fills the space between the inner and outer conductors 140, 145. The inner and outer conductors 140, 145 are formed of nickel-coated aluminum. The outer conductor 145 can have a diameter of about 4 inches and the inner conductor 140 can have a diameter of about 1.5 inches. The stub characteristic impedance is determined by the radii of the inner and outer conductors 140, 145 and the dielectric constant of the insulator 147. The stub 135 of one embodiment has a characteristic impedance of 30 Ohms (where the VHF source power frequency is 162 MHz for a 300 mm wafer diameter). More generally, the stub characteristic impedance exceeds the plasma impedance by about 20%–40% and is smaller than the source power output impedance by about 30%. The stub 135 has an axial length corresponding to a quarter wavelength slightly above 162 MHz (e.g., near 170 MHz) in order to have a slightly offset from (above) the VHF source power frequency of 162 MHz.

A tap 160 is provided at a particular point along the axial length of the stub 135 for applying RF power from the RF generator 150 to the stub 135, as will be discussed below. The RF power terminal 150b and the RF return terminal 150a of the generator 150 are connected at the tap 160 on the stub 135 to the inner and outer coaxial stub conductors 140, 145, respectively. These connections are made via a generator-to-stub coaxial cable 162 having a characteristic impedance that matches the output impedance of the generator 150 (typically, 50 Ohms) in the well-known manner. A terminating conductor 165 at the far end 135a of the stub 135 shorts the inner and outer conductors 140, 145 together, so that the stub 135 is shorted at its far end 135a. At the near end 135b (the unshorted end) of the stub 135, the outer conductor 145 is connected to the chamber body via an annular conductive housing or support 175, while the inner conductor 140 is connected to the center of electrode 125 via a conductive cylinder or support 176. A dielectric ring 180 is held between and separates the conductive cylinder 176 and the electrode 125.

The inner conductor 140 can provide a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas inlets 172 in or adjacent the overhead electrode 125 while the metallic coolant line 173 feeds coolant passages or jackets 174 within the overhead electrode 125.

An active and resonant impedance transformation is thereby provided by this specially configured stub match between the RF generator 150, and the overhead electrode assembly 126 and processing plasma load, minimizing reflected power and providing a very wide impedance match space accommodating wide changes in load impedance. Consequently, wide process windows and process flexibility is provided, along with previously unobtainable efficiency in use of power, all while minimizing or avoiding the need for typical impedance match apparatus. As noted above, the stub resonance frequency is also offset from ideal match to further enhance overall system Q, system stability and process windows and multi-process capability.

Matching the Electrode-Plasma Resonance Frequency and the VHF Source Power Frequency:

As outlined above, a principal feature is to configure the overhead electrode assembly 126 for resonance with the plasma at the electrode-plasma resonant frequency and for the matching (or the near match of) the source power frequency and the electrode-plasma frequency. The electrode assembly 126 has a predominantly capacitive reactance while the plasma reactance is a complex function of frequency, plasma density and other parameters. (As will be described below in greater detail, a plasma is analyzed in terms of a reactance which is a complex function involving imaginary terms and generally corresponds to a negative capacitance.) The electrode-plasma resonant frequency is determined by the reactances of the electrode assembly 126 and of the plasma (in analogy with the resonant frequency of a capacitor/inductor resonant circuit being determined by the reactances of the capacitor and the inductor). Thus the electrode-plasma resonant frequency may not necessarily be the source power frequency, depending as it does upon the plasma density. The problem, therefore, is to find a source power frequency at which the plasma reactance is such that the electrode-plasma resonant frequency is equal or nearly equal to the source power frequency, given the constraints of practical confinement to a particular range of plasma density and electrode dimensions. The problem is even more difficult, because the plasma density (which affects the plasma reactance) and the electrode dimensions (which affect electrode capacitance) must meet certain process constraints. Specifically, for dielectric and metal plasma etch processes, the plasma density should be within the range of $10^9$–$10^{12}$ ions/cc, which is a constraint on the plasma reactance. Moreover, a more uniform plasma ion density distribution for processing 300 mm diameter wafers for example, is realized by a wafer-to-electrode gap or height of about 1.25 inches and an electrode diameter on the order of the wafer diameter, or greater, which is a constraint on the electrode capacitance. On the other hand, a different gap length may be used for processing an even larger wafer.

Accordingly in one feature of the embodiment, by matching (or nearly matching) the electrode capacitance to the magnitude of the negative capacitance of the plasma, the electrode-plasma resonant frequency and the source power frequency are at least nearly matched. For the general metal and dielectric etch process conditions enumerated above (i.e., plasma density between $10^9$–$10^{12}$ ions/cc, a 2-inch gap and an electrode diameter on the order of roughly 11 inches), the match is possible if the source power frequency is a VHF frequency. Other conditions (e.g., different wafer diameters, different plasma densities, etc.) may dictate a different frequency range to realize such a match in carrying out this feature of the reactor. As will be detailed below, under favored plasma processing conditions for processing 8-inch wafers in several principal applications including dielectric and metal plasma etching and chemical vapor deposition, the plasma capacitance in one typical working example having plasma densities as set forth above was between −50 and −400 pico farads. In a working embodiment employing a source power frequency of 210 MHz, the capacitance of the overhead electrode assembly 126 was matched to the magnitude of this negative plasma capacitance by using an electrode diameter of 11 inches, a gap length (electrode to pedestal spacing) of approximately 1¼ inches, choosing a dielectric material for seal 130 having a dielectric constant of 9, and a thickness of the order of one inch, and a dielectric material for the ring 120 having a dielectric constant of 4 and thickness of the order of 10 mm. For 300 mm wafers, the source power frequency may be about 162 MHz.

The combination of electrode assembly 126 and the plasma resonates at an electrode-plasma resonant frequency that at least nearly matches the source power frequency applied to the electrode 125, assuming a matching of their capacitances as just described. We have discovered that for favored etch plasma processing recipes, environments and plasmas, this electrode-plasma resonant frequency and the source power frequency can be matched or nearly matched at VHF frequencies; and that it is highly advantageous that such a frequency match or near-match be implemented. In the foregoing embodiment, the electrode-plasma resonance frequency corresponding to the foregoing values of plasma negative capacitance can be slightly below 162 MHz. The source power frequency is 162 MHz, a near-match in which the source power frequency is offset slightly above the electrode-plasma resonance frequency in order to realize other advantages to be discussed below. If the source power frequency is 210 MHz, then the plasma resonance frequency may be 200 MHz and the stub resonance frequency may be 220 MHz.

The plasma capacitance is a function of among other things, plasma electron density. This is related to plasma ion density, which needs, in order to provide good plasma processing conditions, to be kept in a range generally $10^9$ to $10^{12}$ ions/cc. This density, together with the source power frequency and other parameters, determines the plasma negative capacitance, the selection of which is therefore constrained by the need to optimize plasma processing conditions, as will be further detailed below. But the overhead electrode assembly capacitance is affected by many physical factors, e.g. gap length (spacing between electrode 125 and the wafer 110); the area of electrode 125; the choice of dielectric constant of the dielectric seal 130 between electrode 125 and grounded chamber body 127; the choice of dielectric constant for the dielectric ring 120 between semiconductor ring 115 and the chamber body 127; and the thickness of the dielectric structures of seal 130 and ring 120 and the thickness and dielectric constant of the ring 180.

This permits some adjustment of the electrode assembly capacitance through choices made among these and other physical factors affecting the overhead electrode capacitance. We have found that the range of this adjustment is sufficient to achieve the necessary degree of matching of the overhead electrode assembly capacitance to the magnitude of the negative plasma capacitance. In particular, the dielectric materials and dimensions for the seal 130 and ring 120 are chosen to provide the desired dielectric constants and resulting dielectric values. Matching the electrode capacitance and the plasma capacitance can then be achieved despite the fact that some of the same physical factors influencing electrode capacitance, particularly gap length, will be dictated or limited by the following practicalities: the need to handle larger diameter wafers; to do so with good uniformity of distribution of plasma ion density over the full diameter of the wafer; and to have good control of ion density vs ion energy.

Accordingly, for plasma ion density ranges as set forth above favorable to plasma etch processes, and for chamber dimensions suitable for processing 8 inch wafers, a capacitance for the electrode assembly 126 was achieved which matched the plasma capacitance of −50 to −400 pico farads by using an electrode diameter of 11 inches, a gap length of approximately 2 inches, and a material for the seal 130 having a dielectric constant of 9, and a material for the ring 120 having a dielectric constant of 4.

Given the foregoing range for the plasma capacitance and the matching overhead electrode capacitance, the electrode-plasma resonance frequency was approximately 200 MHz for a source power frequency of 210 MHz. The foregoing values can be adjusted to optimize performance for 300 mm wafers using a source power frequency of 162 MHz.

A great advantage of choosing the capacitance of the electrode assembly 126 in this manner, and then matching the resultant electrode-plasma resonant frequency and the source power frequency, is that resonance of the electrode and plasma near the source power frequency provides a wider impedance match and wider process window, and consequently much greater immunity to changes in process conditions, and therefore greater performance stability. The entire processing system is rendered less sensitive to variations in operating conditions, e.g., shifts in plasma impedance, and therefore more reliable along with a greater range of process applicability. As will be discussed later in the specification, this advantage is further enhanced by the small offset between the electrode-plasma resonant frequency and the source power frequency.

Why the Plasma Has a Negative Capacitance:

The capacitance of the plasma is governed by the electrical permittivity of the plasma, $\epsilon$, which is a complex number and is a function of the electrical permittivity of free space $\epsilon_0$, the plasma electron frequency $\omega_{pe}$, the source power frequency $\omega$ and the electron-neutral collision frequency $\eta_{en}$ in accordance with the following equation:

$$\epsilon = \epsilon_0[1 - \omega_{pe}^2/(\omega(\omega + i\eta_{en}))] \text{ where } i = (-1)^{1/2}.$$

(The plasma electron frequency $\omega_{pe}$ is a simple function of the plasma electron density and is defined in well-known publications on plasma processing.)

In one working example, the neutral species was Argon, the plasma electron frequency was slightly below about 162 MHz, the RF source power frequency was about 162 MHz with chamber pressure in the range of 5 mT to 1000 mT with sufficient RF power applied so that the plasma density was between $10^9$ and $10^{12}$ cc$^{-1}$. Under these conditions, which are typical of those favorable to plasma etch processes, the plasma generally has a negative capacitance because its effective electrical permittivity defined by the foregoing equation is negative. Under these conditions, the plasma had a negative capacitance of −50 to −400 pico farads. Then as we have seen above in more general terms, the plasma capacitance, as a function of plasma electron density (as well as source power frequency and electron-neutral collision frequency) tends to be generally limited by favored plasma process realities for key applications such as dielectric etch, metal etch and CVD, to certain desired ranges, and to have a negative value at VHF source power frequencies. By exploiting these characteristics of the plasma, the electrode capacitance matching and frequency-matching features of the reactor achieve a process window capability and flexibility and stability of operation not previously possible.

Impedance Transformation Provided by the Stub 135:

The stub 135 provides an impedance transformation between the 50 Ohm output impedance of the RF generator 150 and the load impedance presented by the combination of the electrode assembly 126 and the plasma within the chamber. For such an impedance match, there must be little or no reflection of RF power at the generator-stub connection and at the stub-electrode connection (at least no reflection exceeding the VSWR limits of the RF generator 150). How this is accomplished will now be described.

At the desired VHF frequency of the generator 150 and at a plasma density and chamber pressure favorable for plasma etch processes (i.e., $10^9$–$10^{12}$ ions/cm$^3$ and 5 mT–1000 mT, respectively), the impedance of the plasma itself is about (0.3+(i)7)Ohms, where 0.3 is the real part of the plasma impedance, $i = (-1)^{1/2}$, and 7 is the imaginary part of the plasma impedance. The load impedance presented by the electrode-plasma combination is a function of this plasma impedance and of the capacitance of the electrode assembly 126. As described above, the capacitance of the electrode assembly 126 is selected to achieve a resonance between the electrode assembly 126 and the plasma with an electrode-plasma resonant frequency at or slightly less than about 162 MHz for 300 mm wafers. Reflections of RF power at the stub-electrode interface are minimized or avoided because the resonant frequency of the stub 135 is set to be at or near the electrode-plasma resonant frequency so that the two at least nearly resonate together.

At the same time, reflections of RF power at the generator-stub interface are minimized or avoided because the location of the tap 160 along the axial length of the stub 135 is such that, at the tap 160, the ratio of the standing wave voltage to the standing wave current in the stub 135 is near the output impedance of the generator 150 or characteristic impedance of the cable 162 (both being about 50 Ohms). How the tap 160 is located to achieve this will now be discussed.

Axial Location of the Stub Tap 160:

The axial length of the coaxial stub 135 can be a multiple of a quarter wavelength of a "stub" frequency (e.g., slightly above 162 MHz) which, as stated above, is near the electrode-plasma resonant frequency. In one embodiment, this multiple is two, so that the coaxial stub length is about a half wavelength of the "stub" frequency.

The tap 160 is at a particular axial location along the length of the stub 135. At this location, the ratio between the amplitudes of the standing wave voltage and the standing wave current of an RF signal at the output frequency of the generator 150 corresponds to an input impedance matching the output impedance of the RF generator 150 (e.g., 50

Figure 2A:
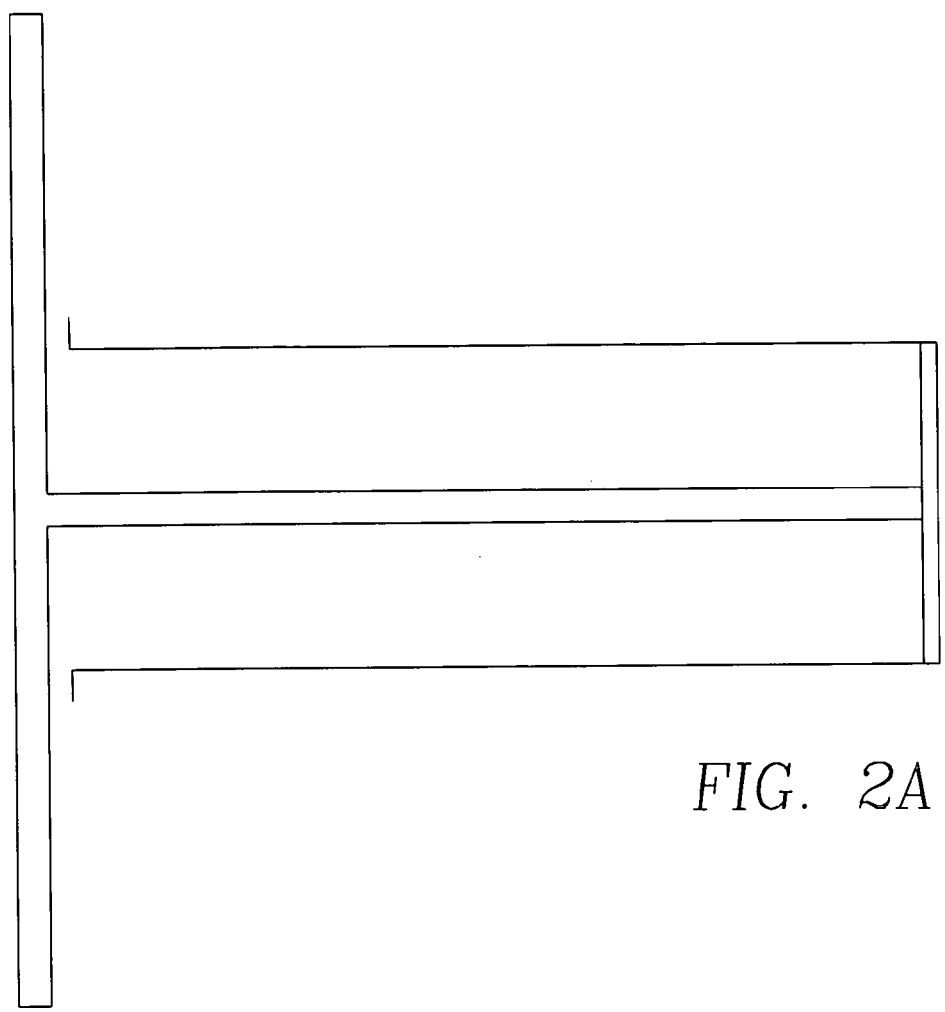
FIGS. 2A and 2B are diagrams illustrating, respectively, the coaxial stub of FIG. 1 and the voltage and current standing wave amplitudes as a function of position along the coaxial stub.
Figure 2B:
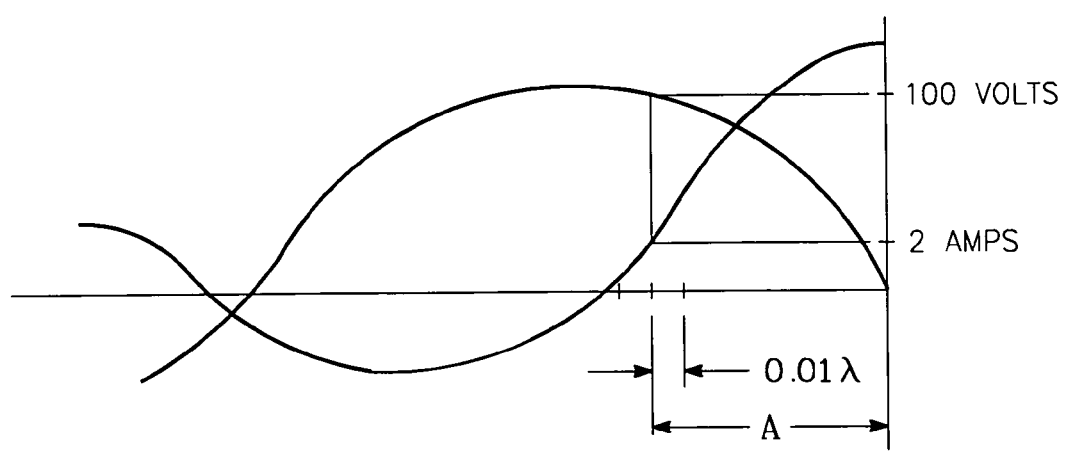

Ohms). This is illustrated in FIGS. 2A and 2B, in which the voltage and current standing waves in the stub 135 have a null and a peak, respectively, at the shorted outer stub end 135a. A desired location for the tap 160 is at a distance A inwardly from the shorted end, where the ratio of the standing wave voltage and current corresponds to 50 Ohms. This location is readily found by the skilled worker by empirically determining where the standing wave ratio is 50 Ohms. The distance or location A of the tap 160 that provides a match to the RF generator output impedance (50 Ohms) is a function of the characteristic impedance of the stub 135, as will be described later in this specification. When the tap 160 is located precisely at the distance A, the impedance match space accommodates a 9:1 change in the real part of the load impedance, if the RF generator is of the typical kind that can maintain constant delivered power over a 3:1 voltage standing wave ratio (VSWR).

The impedance match space can be greatly expanded to accommodate a nearly 60:1 change in the real part of the load impedance. This dramatic result is achieved by slightly shifting the tap 160 from the precise 50 Ohm point at location A toward the shorted external end 135a of the coaxial stub 135. This shift can be, for example, 5% of a wavelength (i.e., about 7.5 inch at 162 MHz for 30 Ohm characteristic impedance). It is our discovery that at this slightly shifted tap location, the RF current contribution at the tap 160 subtracts or adds to the current in the stub, which ever becomes appropriate, to compensate for fluctuations in the plasma load impedance, as will be described below with reference to FIGS. 3 and 4. This compensation is sufficient to increase the match space from one that accommodates a 9:1 swing in the real part of the load impedance to a 60:1 swing.

It is felt that this behavior is due to a tendency of the phase of the standing wave current in the stub 135 to become more sensitive to an impedance mismatch with the electrode-plasma load impedance, as the tap point is moved away from the location at A. As described above, the electrode assembly 126 is matched to the negative capacitance of the plasma under nominal operating conditions. This capacitance is −50 to −400 pico farads at the VHF source power frequency. At this capacitance the plasma exhibits a plasma impedance of (0.3+i7)Ω. Thus, 0.3 Ω is the real part of the plasma impedance for which the system is tuned. As plasma conditions fluctuate, the plasma capacitance and impedance fluctuate away from their nominal values. As the plasma capacitance fluctuates from that to which the electrode 125 was matched, the phase of the electrode-plasma resonance changes, which affects the phase of the current in the stub 135. As the phase of the stub standing wave current thus shifts, the RF generator current supplied to the tap 160 will either add to or subtract from the stub standing wave current, depending upon the direction of the phase shift. The displacement of the tap 160 from the 50 Ohm location at A is limited to a small fraction of the wavelength (e.g., 5%).

Figure 3:
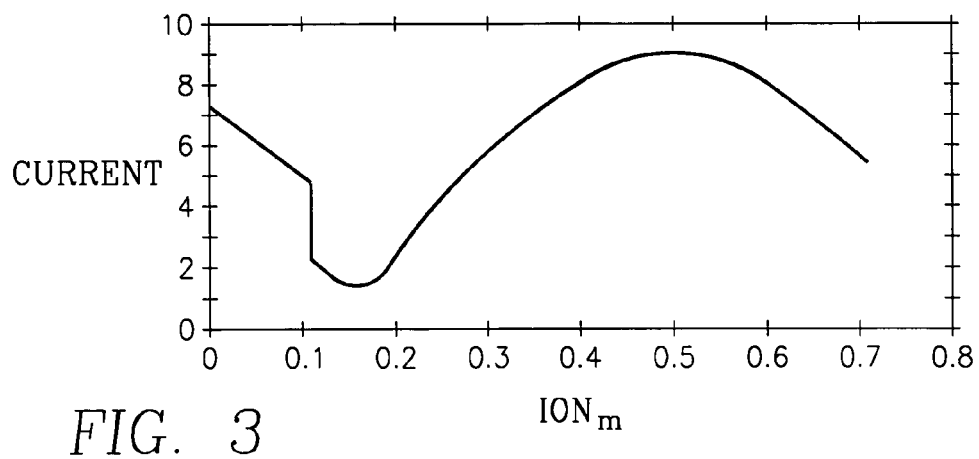
FIG. 3 illustrates the subtraction of current at the input power tap point on the coaxial stub that occurs in response to high plasma load impedance to maintain a more constant delivered VHF power level in a larger match space.

FIG. 3 illustrates the standing wave current in the stub 135 when the real part of the plasma impedance has increased due to plasma variations. In FIG. 3, the current standing wave amplitude is plotted as a function of axial location along the stub 135. A discontinuity in the standing wave current amplitude at the location 0.1 on the horizontal axis corresponds to the position of the tap 160. In the graph of FIG. 3, an impedance mismatch occurs because the real part of the plasma impedance is high, above the nominal plasma impedance for which the system is tuned (i.e., at which the electrode capacitance matches the negative plasma capacitance). In this case, the current at the tap 160 subtracts from the standing wave current in the stub 135. This subtraction causes the discontinuity or null in the graph of FIG. 3, and reduces the delivered power to offset the increased load. This avoids a corresponding increase in delivered power ($I^2R$), due to the higher load (R).

Figure 4:
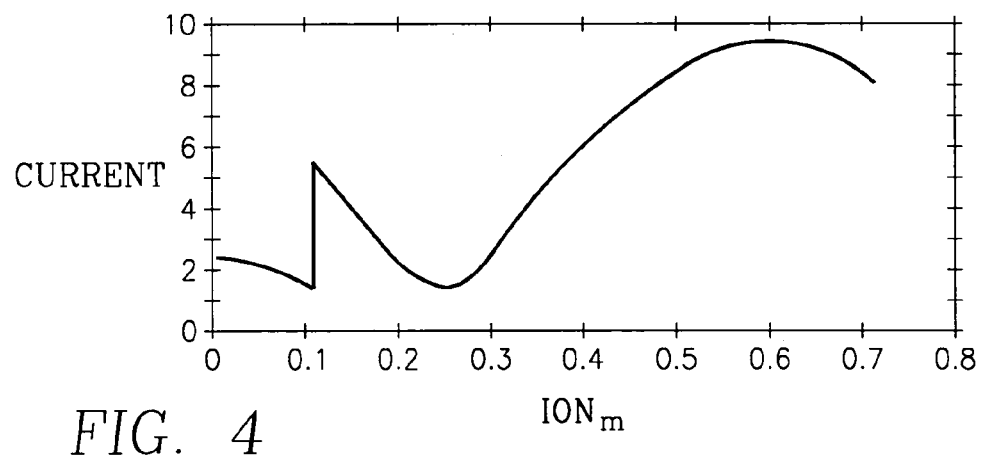
FIG. 4 illustrates the addition of current at the input power tap point on the coaxial stub that occurs in response to low plasma load impedance to maintain a more constant delivered VHF power level in a larger match space.

FIG. 4 illustrates the standing wave current in the stub 135 when the real part of the plasma impedance decreases. In FIG. 4, the current standing wave amplitude is plotted as a function of axial location along the stub 135. A discontinuity in the standing wave current amplitude at the location 0.1 marks the position of the tap 160. In the graph of FIG. 4, the real part of the plasma impedance is low, below the nominal plasma impedance for which the system is tuned. In this case, the current at the tap 160 adds to the standing wave current in the stub 135. This addition increases the delivered power to offset the decreased load, to avoid a concomitant decrease in delivered power, $I^2R$, due to the decreased load, R. With such compensation, much greater changes in load impedance can be accommodated so that the match space in increased significantly.

This expansion of the match space to accommodate a 60:1 swing in the real part of the load impedance enhances process window and reliability of the reactor. This is because as operating conditions shift during a particular process or application, or as the reactor is operated with different operating recipes for different applications, the plasma impedance will change, particularly the real part of the impedance. In the prior art, such a change could readily exceed the range of the conventional match circuit employed in the system, so that the delivered power could no longer be controlled sufficiently to support a viable process, and the process could fail. In the present reactor, the range of the real part of the load impedance over which delivered power can be maintained at a desired level has been increased so much that changes in plasma impedance, which formerly would have led to a process failure, have little or no effect on a reactor embodying this aspect of the reactor. Thus, the invention enables the reactor to withstand far greater changes in operating conditions during a particular process or application. Alternatively, it enables the reactor to be used in many different applications involving a wider range of process conditions, a significant advantage.

As a further advantage, the coaxial stub 135 that provides this broadened impedance match is a simple passive device with no "moving parts" such as a variable capacitor/servo or a variable frequency/servo typical of conventional impedance match apparatus. It is thus inexpensive and far more reliable than the impedance match apparatus that it replaces.

De-Tuning the Operating and Resonant Frequencies to Broaden the Process Window:

In accordance with a further aspect, the system Q is reduced to broaden the process window by slightly offsetting the stub resonant frequency, the electrode plasma resonant frequency and the plasma source power frequency from one another. As described above, the stub resonant frequency is that frequency at which the axial length of the stub 135 is a half wavelength, and the electrode-plasma resonant frequency is the frequency at which the electrode assembly 126 and the plasma resonate together. In one embodiment, the stub 135 was cut to a length at which its resonant frequency was slight above 162 MHz, the RF source power generator 150 was selected to operate at 162 MHz and the resulting electrode-plasma resonant frequency was slight less than about 162 MHz, for 300 mm wafers.

By choosing three such differing frequencies for plasma resonance, stub resonance and source power frequency, rather than the same frequency for all three, the system has been somewhat "de-tuned". It therefore has a lower "Q". The use of the higher VHF source power frequency proportionately decreases the Q as well (in addition to facilitating the match of the electrode and plasma capacitances under etch-favorable operating conditions).

Decreasing system Q broadens the impedance match space of the system, so that its performance is not as susceptible to changes in plasma conditions or deviations from manufacturing tolerances. For example, the electrode-plasma resonance may fluctuate due to fluctuations in plasma conditions. With a smaller Q, the resonance between the stub 135 and the-electrode-plasma combination that is necessary for an impedance match (as described previously in this specification) changes less for a given change in the plasma-electrode resonance. As a result, fluctuations in plasma conditions have less effect on the impedance match. Specifically, a given deviation in plasma operating conditions produces a smaller increase in VSWR at the output of RF generator 150. Thus, the reactor may be operated in a wider window of plasma process conditions (pressure, source power level, source power frequency, plasma density, etc). Moreover, manufacturing tolerances may be relaxed to save cost and a more uniform performance among reactors of the same model design is achieved, a significant advantage. A related advantage is that the same reactor may have a sufficiently wide process window to be useful for operating different process recipes and different applications, such as metal etch, dielectric etch and/or chemical vapor deposition.

Minimizing the Stub Characteristic Impedance to Broaden the Process Window:

Another choice that broadens the tuning space or decreases the system Q is to decrease the characteristic impedance of the stub 135. However, the stub characteristic impedance can exceed the generator output impedance, to preserve adequate match space. Therefore, the system Q can be reduced, to the extent of reducing the amount by which the characteristic impedance of the stub 135 exceeds the output impedance of the signal generator 150.

The characteristic impedance of the coaxial stub 135 is a function of the radii of the inner and outer conductors 140, 145 and of the dielectric constant of the insulator 147 therebetween. The stub characteristic impedance is chosen to provide the requisite impedance transformation between the output impedance of the plasma power source 150 and the input impedance at the electrode 135. This characteristic impedance lies between a minimum characteristic impedance and a maximum characteristic impedance. Changing the characteristic impedance of the stub 135 changes the waveforms of FIG. 2B and therefore changes the desired location of the tap 160 (i.e., its displacement, A, from the far end of the stub 135). The allowable minimum characteristic impedance of the stub 135 is the one at which the distance A of FIG. 2B is zero so that tap 160 would have to be located on the far end 135a of the coaxial stub 135 opposite the electrode 125 in order to see a 50 Ohm ratio between the standing wave current and voltage. The allowable maximum characteristic impedance of the stub 135 is the one at which the distance A of FIG. 2B is equal to the length of the stub 135 so that the tap 160 would have to be close to the near end 135b of the coaxial stub 135 adjacent the electrode 125 in order to see a 50 Ohm ratio between the standing wave current and voltage.

In an initial embodiment, the coaxial stub characteristic impedance was chosen to be greater (by about 30%) than the output impedance of the RF generator 150, in order to provide an adequate match space. The stub impedance must exceed the RF generator output impedance because the impedance match condition is achieved by selecting the location of the tap point 160 to satisfy $$Z_{gen} = a^2 [Z_{stub}^2 / r_{plasma}]$$

where a is determined by the location of the tap point and varies between zero and one. (The quantity a corresponds to the ratio of the inductance of the small portion of the stub 135 between the far end 135a and the tap 160 to the inductance of the entire stub 135.) Since a cannot exceed one, the stub characteristic impedance must exceed the generator output impedance in order to find a solution to the foregoing equation. However, since the Q of the system is directly proportional to the stub characteristic impedance, the amount by which the stub characteristic impedance exceeds the generator output impedance can be somewhat minimized to keep the Q as low as practical. In the exemplary embodiment, the stub characteristic impedance exceeds the generator output impedance by only about 15 Ohms.

However, in other embodiments, the coaxial stub characteristic impedance may be chosen to be less than the plasma power source (generator) output impedance to achieve greater power efficiency with some reduction in impedance match.

Increased Power Efficiency Provided by the Impedance Transformation of the Stub:

As discussed earlier in this specification, plasma operating conditions (e.g., plasma density) that favor plasma etch processes result in a plasma impedance that has a very small real (resistive) part (e.g., less 0.3 Ohm) and a small imaginary (reactive) part (e.g., 7 Ohms). Capacitive losses predominate in the combination electrode-plasma area of the system, because the electrode capacitance is the predominant impedance to power flow in that part of the reactor. Therefore, power loss in the electrode-plasma combination is proportional to the voltage on the electrode-plasma combination. In contrast, inductive and resistive losses predominate in the stub 135, because the inductance and resistance of the stub 135 are the predominant elements of impedance to power flow in the stub 135. Therefore, power loss in the stub 135 is proportional to current in the stub. The stub characteristic impedance is much greater than the real part of the impedance presented by the electrode-plasma combination. Therefore, in the higher impedance stub 135 the voltage will be higher and the current lower than in the lower impedance plasma in which the current will be higher and the voltage lower. Thus, the impedance transformation between the stub 135 and the plasma-electrode combination produces a higher voltage and lower current in the stub 135 (where resistive and inductive losses dominate and where these are now minimized) and a correspondingly lower voltage and higher current at the plasma/electrode (where capacitive losses dominate and where these are now minimized). In this manner overall power loss in the system is minimized so that power efficiency is greatly improved, a significant advantage. In the foregoing embodiment, power efficiency is about 95% or greater.

Thus, the stub 135, configured as described above, serves not only to provide an impedance match or transformation between the generator and the electrode-plasma impedances across a very wide range or window of operating conditions, but in addition provides a significant improvement in power efficiency.

Cross-Grounding:

The ion energy at the wafer surface can be controlled independently of the plasma density/overhead electrode power. Such independent control of the ion energy is achieved by applying an HF frequency bias power source to the wafer. This frequency, (typically 13.56 MHz) is significantly lower than the VHF power applied to the overhead electrode that governs plasma density. Bias power is applied to the wafer by a bias power HF signal generator 200 coupled through a conventional impedance match circuit 210 to the wafer support 105. The power level of the bias generator 200 controls the ion energy near the wafer surface, and is generally a fraction of the power level of the plasma source power generator 150.

As referred to above, the coaxial stub 135 includes a shorting conductor 165 at the outer stub end providing a short circuit between the inner and outer coaxial stub conductors 140, 145. The shorting conductor 165 establishes the location of the VHF standing wave current peak and the VHF standing wave voltage null as in FIG. 2B. However, the shorting conductor 165 does not short out the VHF applied power, because of the coupling of the stub resonance and the plasma/electrode resonance, both of which are at or near the VHF source power frequency. The conductor 165 does appear as a direct short to ground for other frequencies, however, such as the HF bias power source (from the HF bias generator 200) applied to the wafer. It also shorts out higher frequencies such as harmonics of the VHF source power frequency generated in the plasma sheath.

The combination of the wafer 110 and wafer support 105, the HF impedance match circuit 210 and the HF bias power source 200 connected thereto provides a very low impedance or near short to ground for the VHF power applied to the overhead electrode 125. As a result, the system is cross-grounded, the HF bias signal being returned to ground through the overhead electrode 125 and the shorted coaxial stub 135, and the VHF power signal on the overhead electrode 135 being returned to ground through a very low impedance path (for VHF) through the wafer, the HF bias impedance match 210 and the HF bias power generator 200.

The exposed portion of the chamber side wall between the plane of the wafer and the plane of the overhead electrode 125 plays little or no role as a direct return path for the VHF power applied to the overhead electrode 125 because of the large area of the electrode 125 and the relatively short electrode-to-wafer gap. In fact, the side wall of the chamber may be isolated from the plasma using magnetic isolation or a dielectric coating or an annular dielectric insert or removable liner.

In order to confine current flow of the VHF plasma source power emanating from the overhead electrode 125 within the vertical electrode-to-pedestal pathway and away from other parts of the chamber 100 such as the sidewall, the effective ground or return electrode area in the plane of the wafer 110 is enlarged beyond the physical area of the wafer or wafer support 105, so that it exceeds the area of the overhead electrode 125. This is achieved by the provision of the annular semiconductor ring 115 generally coplanar with and surrounding the wafer 110. The semiconductor ring 115 provides a stray capacitance to the grounded chamber body and thereby extends the effective radius of the "return" electrode in the plane of the wafer 110 for the VHF power signal from the overhead electrode. The semiconductor ring 115 is insulated from the grounded chamber body by the dielectric ring 120. The thickness and dielectric constant of the ring 120 is selected to achieve a desirable ratio of VHF ground currents through the wafer 110 and through the semiconductor ring 115. In a one embodiment, the dielectric ring 120 was quartz, having a dielectric constant of 4 and was of a thickness of 10 mm.

In order to confine current flow from the HF plasma bias power from the bias generator 200 within the vertical path between the surface of the wafer and the electrode 125 and avoid current flow to other parts of the chamber (e.g., the sidewall), the overhead electrode 135 provides an effective HF return electrode area significantly greater than the area of the wafer or wafer support 105. The semiconductor ring 115 in the plane of the wafer support 105 does not play a significant role in coupling the HF bias power into the chamber, so that the effective electrode area for coupling the HF bias power is essentially confined to the area of the wafer and wafer support 105.

Enhancement of Plasma Stability:

Plasma stability was enhanced by eliminating D.C. coupling of the plasma to the shorting conductor 165 connected across the inner and outer stub conductors 140, 145 at the back of the stub 135. This is accomplished by the provision of the thin capacitive ring 180 between the coaxial stub inner conductor 140 and the electrode 125. In the embodiment of FIG. 1, the ring 180 is sandwiched between the electrode 125 on the bottom and the conductive annular inner housing support 176. In the exemplary embodiments described herein, the capacitive ring 180 had a capacitance of about 180 picoFarads, depending on the frequency of the bias chosen, about 13 MHz. With such a value of capacitance, the capacitive ring 180 does not impede the cross-grounding feature described above. In the cross-grounding feature, the HF bias signal on the wafer pedestal is returned to the RF return terminal of the HF bias generator 150 via the stub 135 while the VHF source power signal from the electrode 125 is returned to the RF return terminal of the VHF source power generator 150 via the wafer pedestal.

Figure 5:
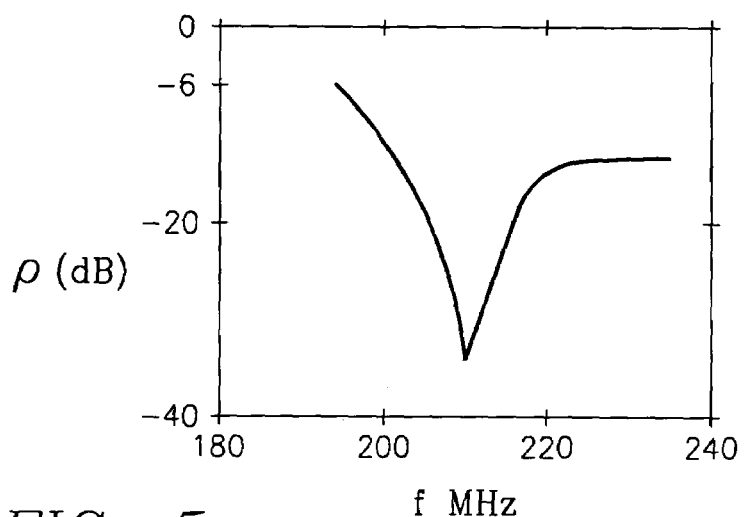
FIG. 5 is a graph illustrating the low-Q reflection coefficient as a function of frequency of the embodiment of FIG. 1.

FIG. 5 is a graph illustrating the reflection coefficient between the VHF power source and the overhead electrode 125 as a function of frequency. This graph illustrates the existence of a very broad band of frequencies over which the reflection coefficient is below 6 dB, which is indicative of the highly advantageous low system Q discussed above.

Figure 6:
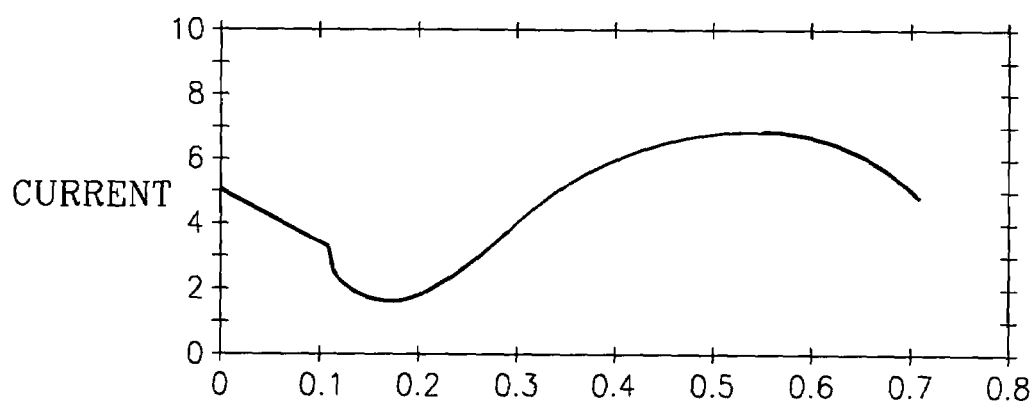
FIG. 6 is a graph illustrating the interaction of the current contribution at the input power tap point on the coaxial stub with the standing wave current and voltage along the stub length.

FIG. 6 illustrates the standing wave current (solid line) as a function of position along the coaxial stub 135 in the case in which the tap 160 is placed at the distance A of FIG. 2B from the shorted end of the stub.

Suppression of Plasma Sheath-Generated Harmonics:

The capacitive ring 180 can play an important role in suppressing plasma sheath-generated harmonics of the HF bias signal applied to the wafer support pedestal 105. The presence of such harmonics degrades process performance, and specifically reduces etch rates. By selecting the capacitance-determining characteristics of the capacitive ring 180 (i.e., dielectric constant and thickness), the return path from the plasma through the overhead electrode 125 and coaxial inner conductor 140 is tuned to resonate (and therefore have a very high admittance) at a particular HF frequency. While one choice for this resonant frequency would be the fundamental of the HF bias signal applied to the wafer support pedestal 105, the etch rate can be improved by 10% to 15% by selecting this resonance to be the second harmonic of the bias signal. Such a favorable result is achieved because harmonics generated by the non-linear load presented by the plasma sheath are quickly returned to ground through the low impedance path presented by the overhead electrode and coaxial center conductor 140 by virtue of the capacitive ring 180.

Selection of the thickness of the capacitive ring 180 to tune the return path through the overhead electrode 125 to a particular HF frequency is affected by a number of factors, including the capacitance of the thin plasma sheath at the overhead electrode 125, the capacitance of the thick plasma sheath at the wafer support pedestal 105 as well as the capacitance of the plasma itself. For this purpose, the ring 180 may be thinner than as shown as FIG. 1. Numerous conventional techniques may be readily employed by the skilled worker to find the correct thickness of the capacitive ring 180 to achieve resonance at the selected HF frequency given the particular plasma operating conditions, including trial and error.

Figure 7:
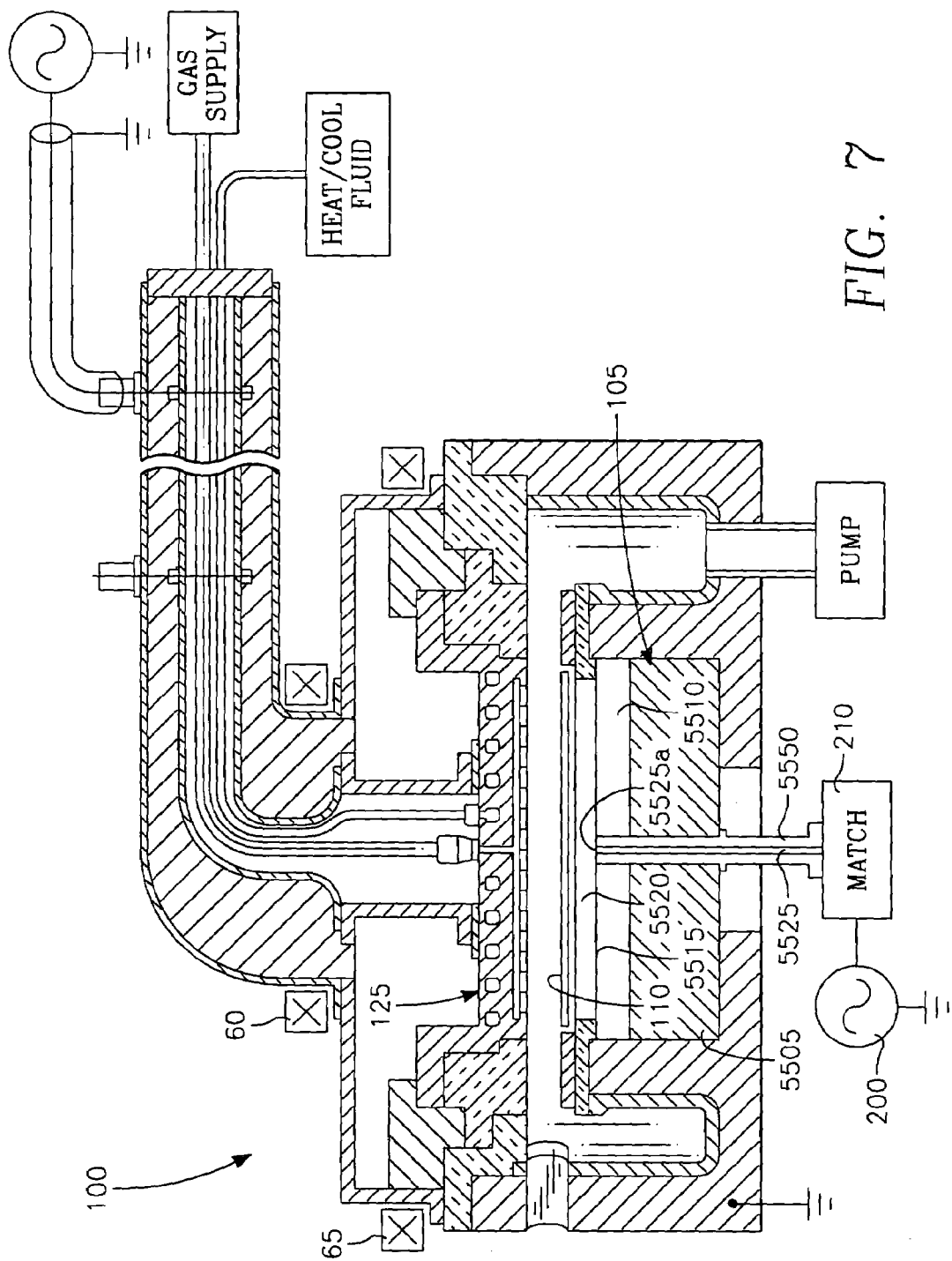
FIG. 7 illustrates a capacitively coupled plasma reactor having a dielectric sleeve surrounding the conductor connected to the wafer bias feed point.

Bias Circuit Tuning for Uniform Radial Plasma Distribution:

FIG. 7 illustrates a plasma reactor that includes a feature for promoting uniform radial distribution of VHF source power deposition and uniform radial distribution of the HF bias electrical field near the workpiece surface. The reactor of FIG. 7 includes the elements of the reactor of FIG. 24 which have been described above, including the overhead VHF electrode 125. In addition, FIG. 7 illustrates in greater detail the structure of the workpiece support pedestal 105. The workpiece support cathode 105 includes a metal pedestal layer 5505 supporting a lower insulation layer 5510, an electrically conductive mesh layer 5515 overlying the lower insulation layer 5510 and a thin top insulation layer 5520 covering the conductive mesh layer 5515. The semiconductor workpiece or wafer 110 is placed on top of the top insulation layer 5520. The electrically conductive mesh layer 5515 and the metal pedestal layer 5505 may be formed of molybdenum and aluminum respectively. The insulation layers 5510 and 5520 may be formed of aluminum nitride or alumina, for example. The conductive mesh layer 5515 supplies the RF bias voltage to control ion bombardment energy at the surface of the wafer 110. The conductive mesh 5515 also can be used for electrostatically chucking and de-chucking the wafer 110, and in such a case can be connected to a chucking voltage source in the well-known fashion. The conductive mesh 5515 therefore is not necessarily grounded and can have, alternately, a floating electric potential or a fixed D.C. potential in accordance with conventional chucking and de-chucking operations. As referred to previously in this specification, the wafer support cathode 105 and in particular the metal pedestal layer 5505 typically (but not necessarily) is connected to ground, and forms part of a return path for VHF power radiated by the overhead electrode 125.

The RF bias generator 200 produces power in the HF band (e.g., 13.56 MHz). Its RF bias impedance match element 210 is coupled to the workpiece 110 by an elongate conductor 5525 (hereinafter referred to as an RF conductor) extending through the workpiece support cathode 105. The RF conductor 5525 is insulated from grounded conductors such as the aluminum pedestal layer 5505. The RF conductor 5525 has a top termination or bias power feed point 5525*a* in electrical contact with the conductive mesh 5515.

Figure 8:
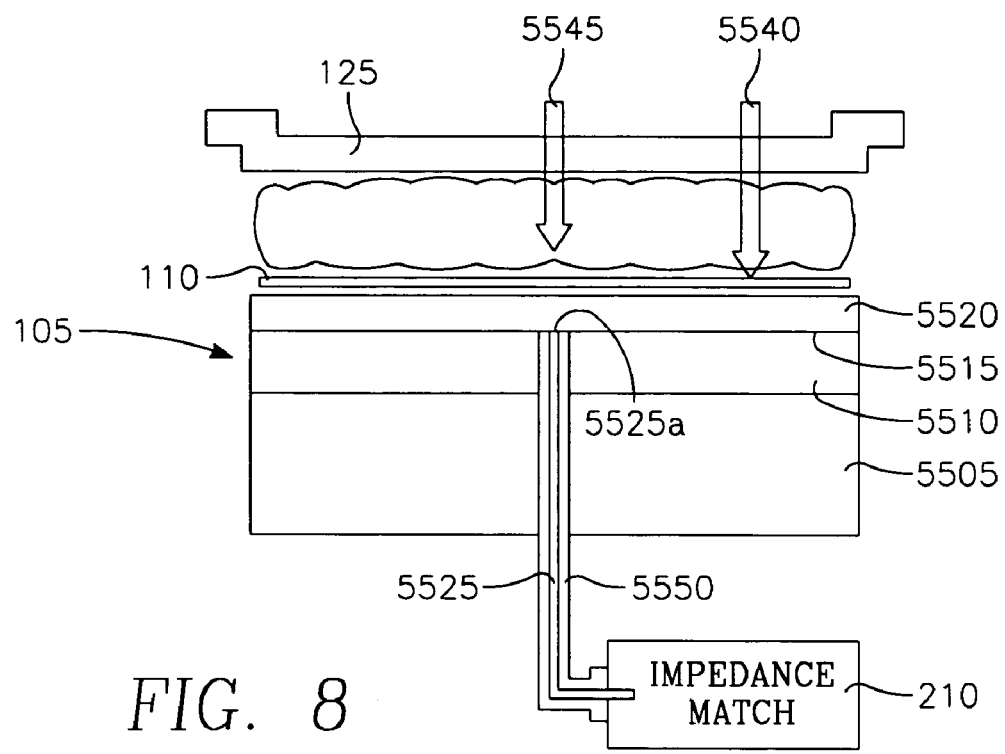
FIG. 8 is an enlarged side view showing the dielectric sleeve.
Figure 9:
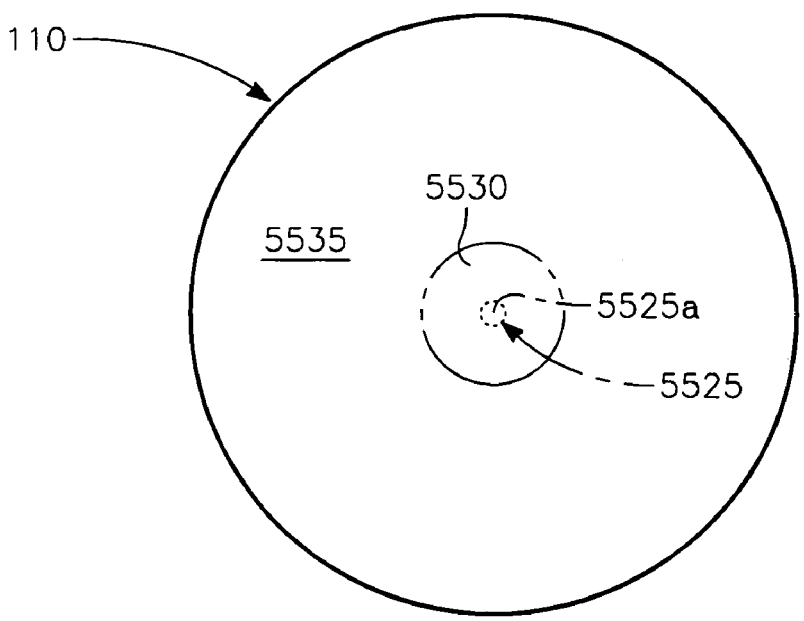
FIG. 9 is corresponding top view showing the sleeve location relative to other portions of the reactor.

FIG. 8 is a schematic illustration of the circuit consisting of the VHF overhead electrode, the RF bias applied through the workpiece support cathode 105 and the elements of the cathode 105. FIG. 9 is a top plan view of the plane of the wafer 110, with the termination or feed point 5525*a* of the RF conductor 5525 being shown in hidden (dashed) line. The RF return path provided by the workpiece support cathode 105 consists of two portions in the plane of the wafer 110, namely a radially inner portion 5530 centered about and extending outwardly from the feed point 5525*a* and a radially outer annular portion 5535. The RF return paths provided by the two portions 5530, 5535 are different, and therefore the two portions 5530, 5535 present different impedances to the VHF power radiated by the overhead electrode 125.

The major reason for the difference in impedances of the two RF return paths will now be explained in general terms. The primary return path is provided by the conductive mesh 5515 which is coupled through the metal pedestal 5505 and RF conductor 5525. The RF return path 5540 (FIG. 8) passing through the outer region 5535 of FIG. 9 is dominated by reactive coupling through the semiconductor wafer 110 and across the conductive mesh layer 5515 to the metal pedestal layer 5505. In contrast, the RF return path 5545 (FIG. 8) through the inner portion 5530 of FIG. 9 is dominated by the reactive impedance of the feed point 5525*a*. The two RF return paths cause non-uniform coupling of RF power if the impedance is not uniform across the wafer.

Since the two RF return paths are physically different, they tend to offer different impedances to the VHF power radiated by the overhead electrode 125. Such differences may cause non-uniformities in radial distribution across the wafer surface of impedance to the VHF power, rendering source power coupling to the plasma nonuniform and giving rise to nonuniform radial distribution of plasma ion density near the surface of the workpiece. This in turn can cause processing non-uniformities that unduly narrow the process window. In order to solve this problem, the reactor of FIG. 7 includes certain features that adjust the feed point impedance presented by the RF conductor 5525 to the VHF power, to enable a more uniform radial distribution of impedance across the wafer surface and therefore more uniform coupling of VHF power across the wafer surface.

A principal purpose of this adjustment in the feed point impedance is to bring the impedance at the feed point 5525*a* to at least nearly zero at the source power frequency (i.e., the VHF frequency of the overhead electrode 125 of about 162 MHz). As a result of this adjustment, the RF current return path is dominated by the conductive mesh 5515 through the RF conductor 5525 while minimizing the current through the aluminum pedestal layer 5505. As a result, the impedances of the regions 5530 and 5535 can be made to be at least nearly the same.

In order to adjust the feed point impedance as set forth above, a dielectric cylindrical sleeve 5550 surrounds the RF conductor 5525. The axial length and the dielectric constant of the material constituting the sleeve 5550 determine the feed point impedance presented by the RF conductor 5525 to the VHF power. In one example, the length and dielectric constant of the sleeve 5550 is selected to bring the feed point impedance to nearly zero at the VHF source power frequency (e.g., 162 MHz). In a working example, the feed point impedance without the sleeve 5550 was (0.9+j41.8) Ohms and with the sleeve was nearly a short circuit at (0.8+j0.3) Ohms. The impedance presented by the outer region 5535 surrounding the feed point 5525*a* is nearly a short at 162 MHz (due mainly to the presence of the conductive mesh 5515). Therefore, in the latter example the sleeve 5550 may bring the feed point impedance at the source power frequency to a value closer to that of the surrounding region. Here, the impedance of the region surrounding the feed point is determined mainly by the conductive mesh 5515. As a result, a more uniform radial distribution of impedance is attained, for more uniform capacitive coupling of VHF source power.

The sleeve 5550 can include additional features facilitating the foregoing improvement in VHF power deposition while simultaneously solving a separate problem, namely improving the uniformity in the electric field created by the RF bias power (at 13.56 MHz for example) applied to the wafer 110 by the RF conductor 5525. The problem is how to adjust radial distribution of VHF power coupling for maximum uniformity of plasma-ion density while simultaneously adjusting the HF bias power electric field distribution across the wafer surface for maximum uniformity. Maximum uniformity would be attained if the feed point impedance at the HF bias power frequency were brought nearer to that of the surrounding region 5535 dominated by the conductive mesh 5515 (without altering the feed point impedance at the VHF source power frequency). This problem is solved by dividing the sleeve 5550 along its cylindrical axis into plural cylindrical sections, and adjusting or selecting the length and dielectric constant of each section independently. This provides several independent variables that may be exploited to permit matching the feed point impedance to that of the surrounding region at both the bias frequency (e.g., 13.56 MHz) and at the source frequency (e.g., 162 MHz) simultaneously.

Referring to the working example of FIG. 10, the sleeve 5550 can be divided into three sections, namely a top section 5552, a middle section 5554 and a bottom section 5556. The top section 5552 was polytetrafluoroethylene and was three inches in length, the middle section was alumina and was four inches in length, and the bottom section was polytetrafluoroethylene and was three inches in length. In this working example, it was found that the uniformity of plasma ion density distribution (as measured by etch rate distribution) was improved with large VHF source power applied to the overhead electrode 125, indicating an improved VHF source power deposition. Improvement in HF bias power deposition was also observed because uniformity of plasma ion density distribution was improved when only bias power was applied in this working example. Thus, the foregoing working example is representative of a simultaneous solution to the problems of (a) non-uniform impedance at the VHF source power frequency (e.g.,162 MHz) and (b) non-uniform impedance at the HF bias power frequency (e.g., 13.56 MHz) across the wafer support pedestal.

It is felt that the length and dielectric constant of the sleeve top section 5552 can be selected and fixed to optimize the HF bias power deposition exclusively, and that the lengths and dielectric constants of the remaining sleeve sections 5554, 5556 can then be selected to optimize VHF source power deposition by the overhead electrode while leaving the HF bias power deposition optimized.

FIG. 11A illustrates how the sleeve 5550 may be adjustable during use. In FIG. 11A, an external control knob 5560 is provided on the reactor. The control knob turns a screw 5565 threadably engaged with a sleeve support 5570 coupled to the bottom of the sleeve 5550 of FIG. 7. As the knob 5560 is rotated, the sleeve support 5570 travels axially along the axis of the threaded screw 5565, forcing the entire sleeve 5550 to travel in the same direction (either up or down) within a sleeve guide 5558. The knob 5560 permits the user to adjust the feed point impedance by moving the sleeve 5550 up or down along the RF conductor 5525 during (or shortly before) operation of the reactor. The sleeve support 5570 may move the entire sleeve 5550 (for example, all three sections 5552, 5554, 5556 as a unit together). Or, the sleeve support 5570 can be coupled to only one or two of the three sections 5552, 5554, 5556 so that only one or two of the three sections is moved by rotating the knob 5560.

Finally, as shown in FIG. 11B, three knobs 5560a, 5560b, 5560c separately engage three sleeves supports 5570a, 5570b, 5570c. The three sleeve supports 5570a, 5570b, 5570c are individually connected to respective ones of the three sleeve sections 5552, 5554, 5556 so that the positions of each of the sleeve sections 5552, 5554, 5556 are separately determined within the sleeve guide 5558a by the three knobs 5560a, 5560b, 5560c.

Figure 12:
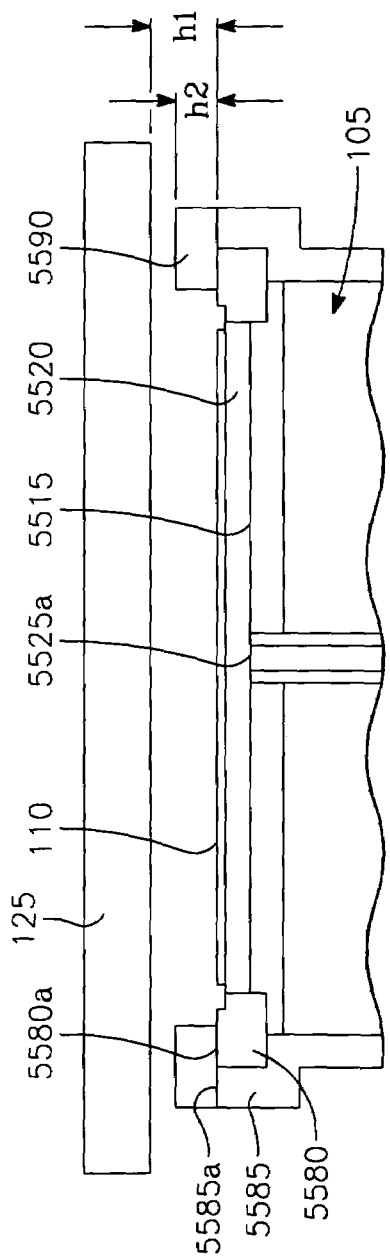
FIG. 12 is a side view of a plasma reactor having a bottom RF coupling ring.

RF Coupling Ring for Enhancing Plasma Uniformity:

It has been previously noted herein that plasma ion density distribution in a reactor having an overhead VHF electrode such as the electrode 125 tends to be center high with a non-uniformity of about 10%. This non-uniformity is reduced by selectively enhancing capacitive coupling from the overhead electrode 125 to the plasma in the vicinity of the workpiece periphery. Referring to FIG. 12, an annular RF coupling ring is placed over and in electrical contact with the outer periphery of the wafer support cathode 105. As shown in FIG. 12, the top insulation layer 5520 is surrounded by a removable ring 5580 whose top surface 5580a is coplanar with the top surface of the wafer. The removable ring 5580 can be formed of a process-compatible material such as silicon, for example. Optionally, removable metal ground ring 5585 surrounds the removable ring 5580, its top surface 5585a being coplanar with that of the removable ring 5580. A generally planar surface is provided across the top of the wafer support cathode 105 bounded by the periphery of the ground ring 5585, facing the generally planar surface of the bottom of the overhead electrode 125. As a result, capacitive coupling across the entire processing zone bounded by the overhead electrode 125 and the wafer support cathode 105 is generally uniform. In order to overcome non-uniformity inherent in the center-high plasma ion density distribution of the reactor, capacitive coupling by the overhead electrode 125 is enhanced near the outer portion of the workpiece 110 by placing an RF coupling ring 5590 over the removable ring 5580 and over grounded ring 5585. The RF coupling ring 5590 may be a conductor, a semiconductor or a dielectric. If the coupling ring 5590 is a dielectric, then capacitive coupling to the plasma near the wafer periphery is enhanced by the presence of the dielectric material. If the RF coupling ring 5590 is a conductor, it in effect narrows the electrode-to-counterelectrode spacing and thereby enhances capacitance near the peripheral region of the wafer 110. Thus, the electrode-to-counterelectrode spacing is hi everywhere in the process zone except at the periphery occupied by the RF coupling ring 5590 where the spacing is reduced from hi by the height h2 of the coupling ring 5590. The increased capacitive coupling of source power enhances ion density at the periphery. The increase in ion density extends inwardly from the RF coupling ring 5590 and extends over a peripheral portion of the workpiece 110. Thus, the plasma ion density over the workpiece 110 is less center high and may tend toward being more nearly uniform, or possibly slightly edge-high. This condition is optimized by a careful selection of the height (thickness) h2 of the RF coupling ring 5590.

Figure 13:
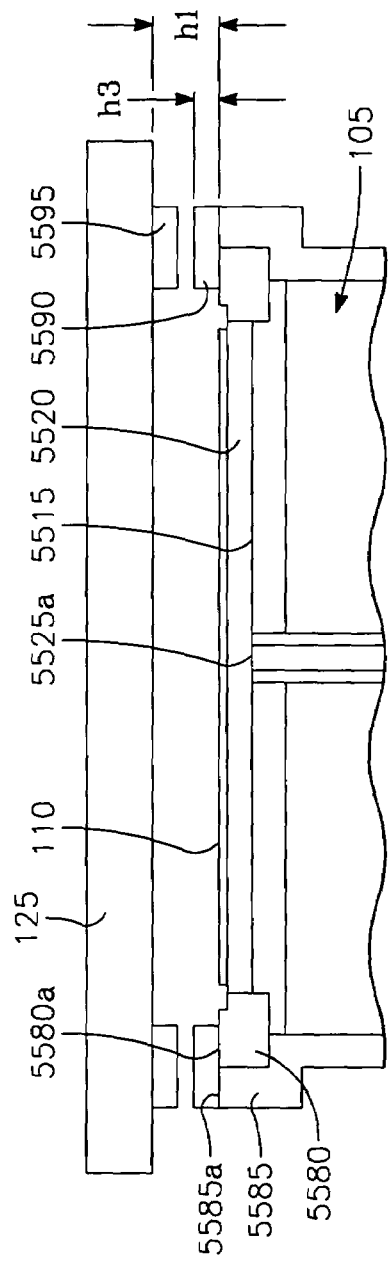
FIG. 13 is a side view of a plasma reactor having top and bottom RF coupling rings.

FIG. 13 illustrates a modification of the reactor of FIG. 12 in which a second RF coupling ceiling ring 5595 is attached to the periphery of the bottom surface of the overhead electrode 125 and overlies the first RF coupling ring 5590. If each ring 5590, 5595 has a thickness (height) of h3, then the electrode-to-counterelectrode distance near the wafer periphery is reduced by twice h3 and the capacitance in that region is enhanced proportionately, as in the reactor of FIG. 12.

Figure 14:
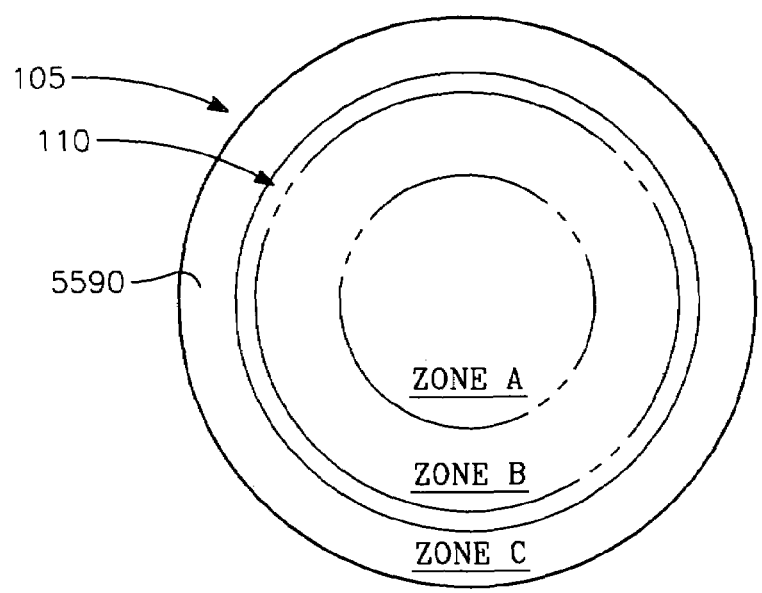
FIG. 14 is a top view illustrating the various radial processing zones in the reactor of FIG. 13 or 62 affected by the RF coupling ring.
Figure 15:
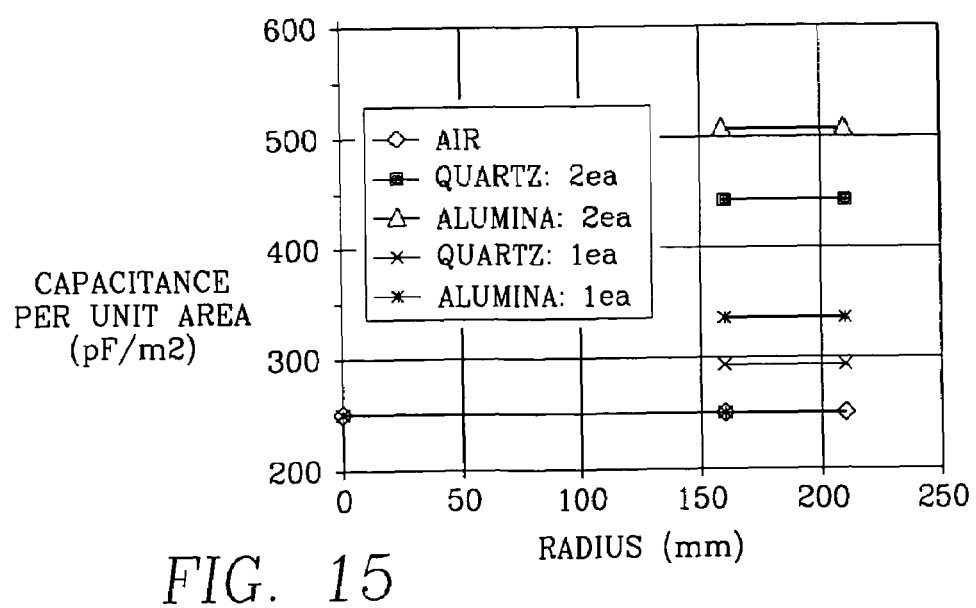
FIG. 15 is a graph comparing radial distribution of capacitance for RF coupling rings of different materials.

FIG. 14 is a top plan view of the wafer support cathode 105 with the wafer 110 mounted on it, and showing the peripheral region occupied by the RF coupling ring 5590. The illustration of FIG. 14 shows the processing zone being divided into three regions, namely an inner central region (zone A) around the center of the wafer 110, an annular region (zone B) extending to the periphery of the wafer 110 and an outer region (zone C) occupied by the RF coupling ring 5590. The graph of FIG. 15 shows the radial distribution of capacitance for different materials (quartz, alumina) and different thickness (0.4 inch and 0.8 inch) of the RF coupling ring 5590. The baseline for comparison is no ring (air). FIG. 15 shows maximum capacitance in zone C. Thus, plasma ion density is enhanced over much of the peripheral region (zone B) of the wafer 110 by the presence of the RF coupling ring 5590 or rings 5590, 5595.

Pressure-Invariant Impedance Match:

As described above with reference to FIG. 1, a wide process window is realized by setting the source power frequency and the fixed match (coaxial stub) resonant frequency to be nearly the same as the electrode-plasma resonant frequency. The electrode-plasma resonant frequency typically is a VHF frequency. As described above, nearly matching or slightly offsetting the source power frequency, the coaxial stub resonant frequency and the electrode-plasma resonant frequency from one another enables the fixed impedance match to maintain an impedance match for the source power generator across wide ranges of plasma source power and plasma bias power.

A problem arose, in that it became a goal to have the reactor work well over an extremely wide range of chamber pressures, i.e., from 5 to 1000 mT as well as an extremely wide range of plasma densities, i.e., from $1\times10^{10}$ to $10\times10^{10}$ ions/cc without exceeding the impedance mismatch tolerance of the VHF generator 150, typically a 3:1 VSWR (voltage standing wave ratio). Unfortunately, it was found that the plasma-electrode resonance frequency changed significantly as chamber pressure was varied over such a wide range. This caused the electrode-plasma resonance to shift away from the source power frequency and the fixed match resonance frequency, a serious problem that led to an impedance mismatch exceeding the 3:1 VSWR limit of the VHF generator 150. Such a departure from the match space leads to lack of control over the source power delivered to the plasma and hence a lack of control over certain process parameters, particularly plasma ion density. We discovered that this problem arose from the dependence of the dielectric constant (electrical permittivity) of the bulk plasma on the pressure-sensitive electron-neutral collision frequency. The equation governing the dielectric constant is as follows:

$$1-\omega_p^2/[\omega(\omega+i\nu_{en})]$$

where $\omega_p$ is the plasma frequency, $\omega$ is the frequency of the source power generator 150, $i=(-1)^{1/2}$, and $\nu_{en}$ is the electron-neutral collision frequency. The plasma admittance is:

$$i\omega\epsilon_0[1-\omega_p^2/(\omega(\omega+i\nu_{en}))]\Pi r^{2/d}.$$

The plasma admittance (impedance) determines the resonance with the overhead electrode 125, and therefore the resonant frequency will wander with the chamber pressure because the electron neutral collision frequency changes with chamber pressure. As the resonant frequency wanders away from the source power frequency, impedance match is impaired. The result is that the pressure range over which the reactor can maintain an impedance match is narrow, much narrower than the desired range of 5 mT to 1000 mT.

We have overcome this limitation by adding to the resonant circuit a new reactive element whose reactance is unaffected by changes in chamber pressure. This new element is the reactance of the cathode or wafer support pedestal 105. This is accomplished by increasing the reactance of the cathode at the source power frequency so that its impedance becomes a significant element in the resonant circuit including the overhead electrode, the bulk plasma and the coaxial stub. The main advantage is that the cathode reactance is pressure-insensitive, so that its capacitance buffers the effect of changes in the electron-neutral collision frequency with pressure. The result is that the chamber is operable over the extremely wide pressure range of 5–1000 mT.

This feature represents a change from our earlier implementation of the embodiment of FIG. 1. In the early implementations, the cathode impedance at the source power frequency we initially employed was so negligible that the cathode was virtually a short to ground, so that the cathode reactance was, essentially, not an element of the resonant circuit comprising the bulk plasma and the overhead electrode 125. The cathode impedance (capacitive reactance) is increased in the present implementation by increasing the thickness of the insulating layer in the cathode.

Introducing the cathode impedance as an additional element in the resonant circuit changes the structure of the resonant circuit and changes the resonant frequency. This requires that the cathode capacitance, the overhead electrode capacitance and the bulk plasma impedance form a resonance, and that the VHF source power frequency be near the resonant frequency. In one implementation, the foregoing parameters were selected so that the resonant frequency remained at 162 MHz, a frequency we had chosen prior to this invention.

In order to achieve optimum performance, we have found that the cathode capacitance can be selected so that:

the cathode continues to have a uniform distribution of capacitance across its surface using the features of FIGS. 8, 9 and 10, the impedance of the cathode capacitance at the source power frequency is not very much in excess of the plasma admittance at the bias power frequency, the cathode has reasonable efficiency as a return path for the VHF source (does not consume a significant amount of power), works with the fixed impedance match provided by the tuning stub.

Item (4) poses a problem because the desired range in plasma electron density over which the reactor should operate (i.e., $0.5\times10^{10}$ to $10\times10^{10}$/cc) corresponds possibly to a 20:1 dynamic range in plasma admittance. However, what was found is that, with the appropriate selection of the cathode capacitance, the plasma admittance did not follow the plasma electron density in a linear fashion, but instead behaved non-linearly so that plasma admittance was compressed in a narrow range that held the VSWR at the source impedance match within a 3:1 range over which the fixed match can operate.

In addition, we have found that the capacitance of the cathode can be selected so that the foregoing constraints are met:

at the desired plasma density, at the desired plasma thickness (e.g., 3 cm), where plasma thickness is limited by a minimal gas residence time corresponding to a low degree of ion dissociation and therefore high etch selectivity, at a desired chamber geometry (300 mm wafer or cathode diameter), 0.5 mm sheath thickness.

Figure 16:
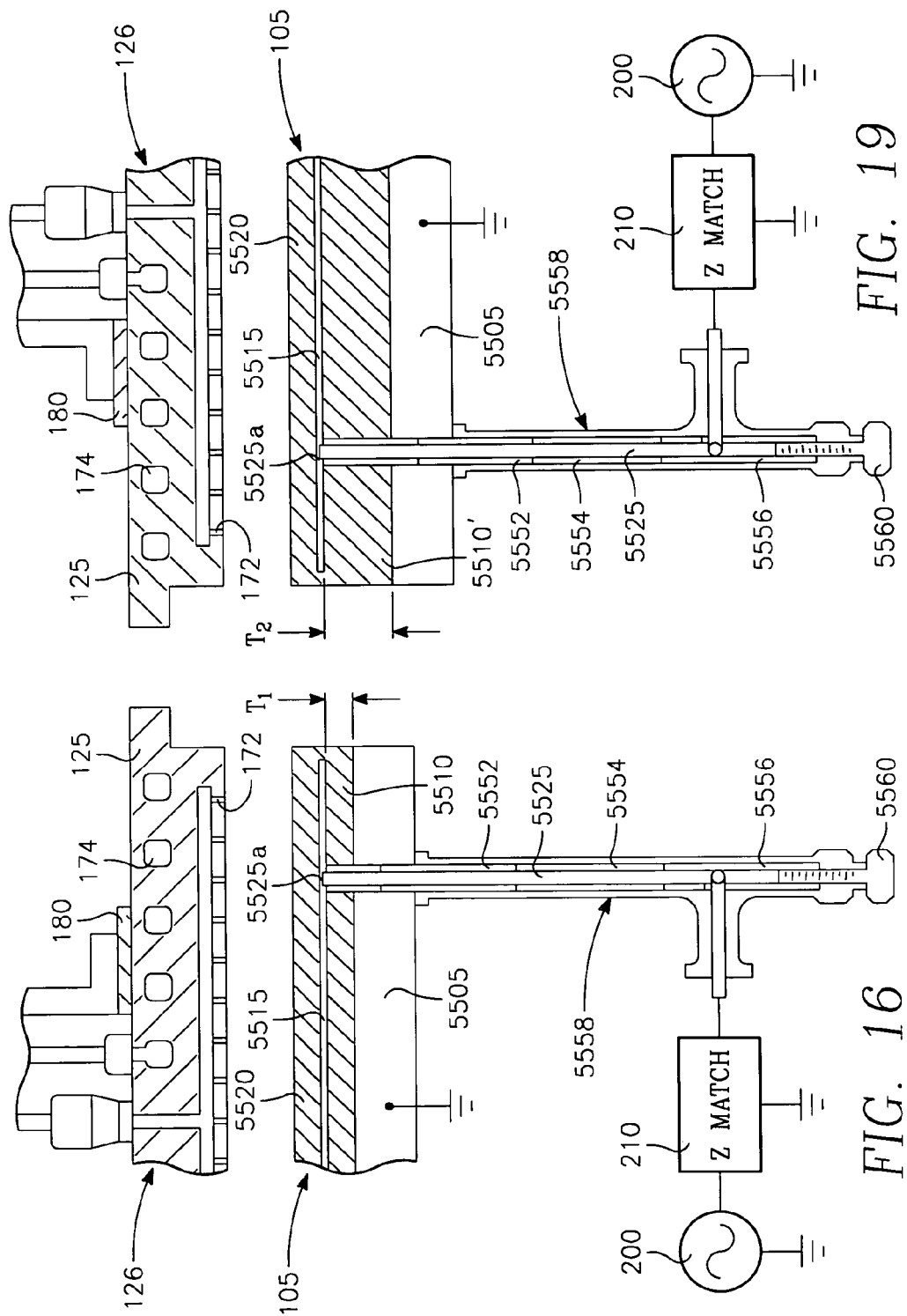
FIG. 16 illustrates a plasma reactor corresponding to FIG. 7 with a uniform capacitance across the cathode, and having a negligible cathode impedance at the source power frequency.
Figure 17:
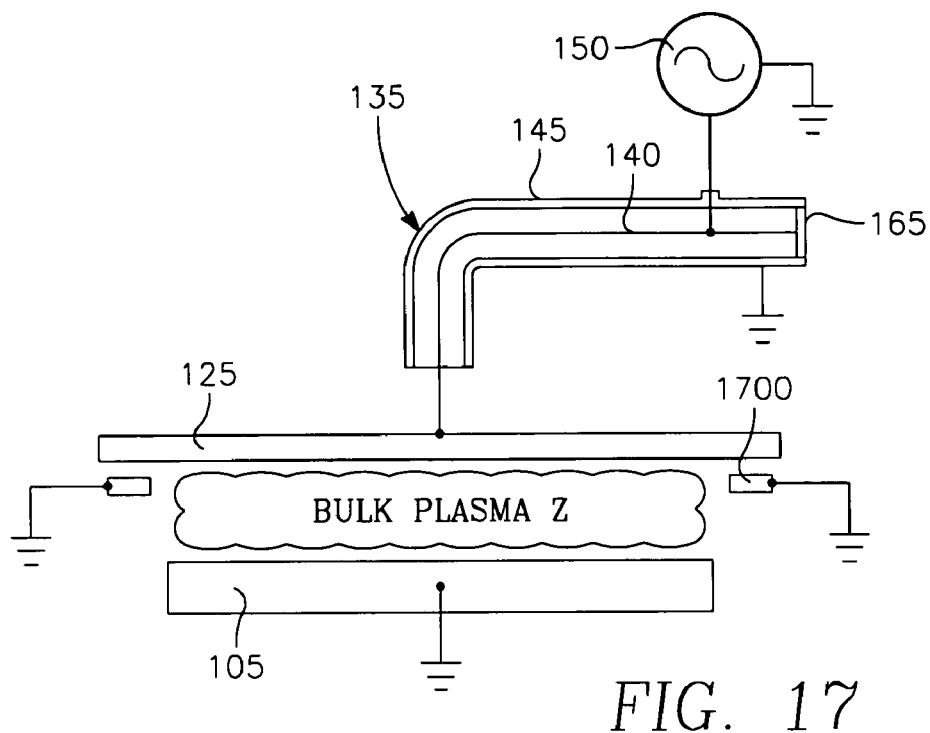
FIG. 17 is a simplified schematic diagram of the resonant circuit elements including the bulk plasma in the reactor of FIG. 16.
Figure 18:
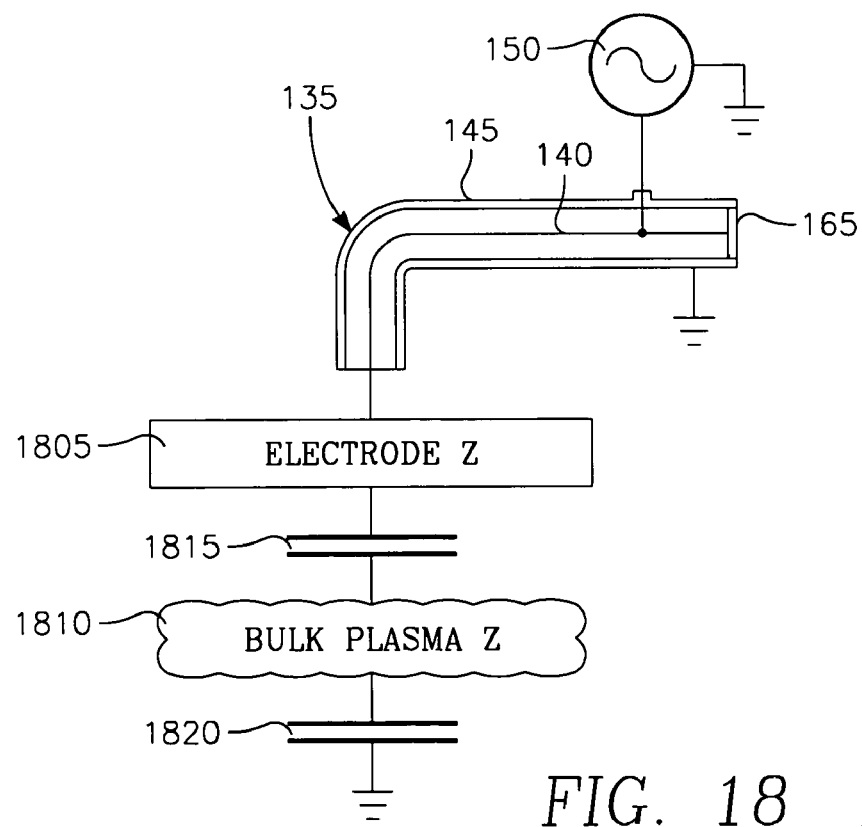
FIG. 18 illustrates an equivalent circuit corresponding to the reactor of FIG. 16.

As mentioned briefly above, the initial implementation of the embodiment of FIG. 1 had such a small cathode impedance that the cathode 105 essentially functioned as a short to ground. As a result, the resonance of the plasma was determined by the bulk plasma impedance and the overhead electrode impedance, the cathode having virtually no effect on the resonant frequency. The resonance was highly dependent upon the plasma impedance, which is varies significantly over wide changes in chamber pressure. FIG. 16 illustrates the structure of one implementation of the embodiment of FIG. 7, including the center conductor 5525 surrounded by the adjustable dielectric tuning sleeves 5552, 5554, 5556, and the elements of the cathode 105 including the grounded metal base 5505, the intermediate insulator layer 5510, the conductive mesh 5515 connected to the RF bias feedpoint 5525a, and the top insulator layer 5520. FIG. 17 is a simplified schematic diagram representing this structure, showing the overhead electrode 125 being driven through a coaxial tuning stub 135 by the VHF source power generator 150. The inner conductor 140 of the tuning stub 135 is shorted to the grounded outer conductor 145 by the outer end piece 165. The capacitance to ground of the overhead electrode is represented by the capacitor 1700 in FIG. 17. The cathode 105 (i.e., the wafer support pedestal) is shown as connected directly to ground. This is because, initially, the source power frequency and the cathode capacitance were both so great that the impedance to ground presented by the cathode at the source power frequency was negligible compared to the impedance of the bulk plasma and the impedance of the overhead electrode 125. As a result, there were only two important elements determining the resonant frequency, namely the bulk plasma impedance and the overhead electrode capacitance. The equivalent circuit is illustrated in FIG. 18, showing the two main elements of the resonant circuit, namely the overhead electrode impedance 1805 and the bulk plasma impedance 1810 being connected in series between the tuning stub 135 and a capacitance 1820 representing the cathode 105. In addition, FIG. 18 shows that there is an anode plasma sheath represented by an equivalent capacitor 1815 in series between the electrode impedance 1805 and the bulk plasma impedance 1810. Furthermore, a cathode plasma sheath is represented by an equivalent capacitor 1820 in series between the bulk plasma impedance 1810 and the cathode capacitance 1820.

The problem of a limited range of chamber pressure over which an impedance match is maintained was caused by the tendency of the resonant frequency to change with changes in chamber pressure, as described above. This problem is solved by decreasing the capacitance of the cathode 105 so as to increase the impedance of the cathode 105. As described above with reference to FIG. 1, the capacitance of the overhead electrode was selected relative to the plasma impedance to produce a resonant frequency near 162 MHz, and the frequency of the source power generator 150 was set at 162 MHz. The cathode capacitance was selected to provide a significant impedance at this frequency, comparable to the impedance of the overhead electrode 125 and to within an order of magnitude of the bulk plasma impedance.

Figure 20:
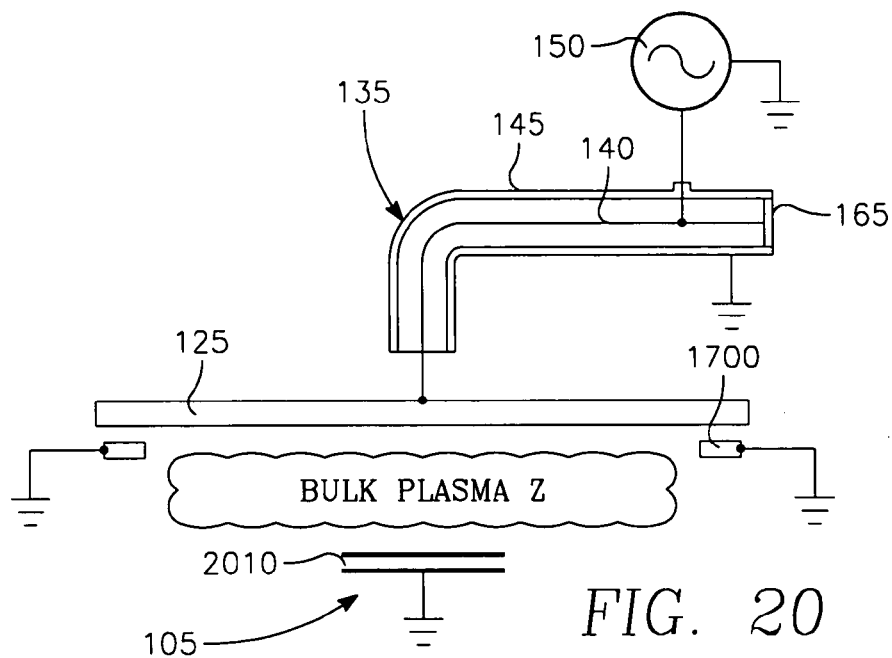
FIG. 20 is a simplified schematic diagram of the resonant circuit elements including the bulk plasma in the reactor of FIG. 19.
Figure 21:
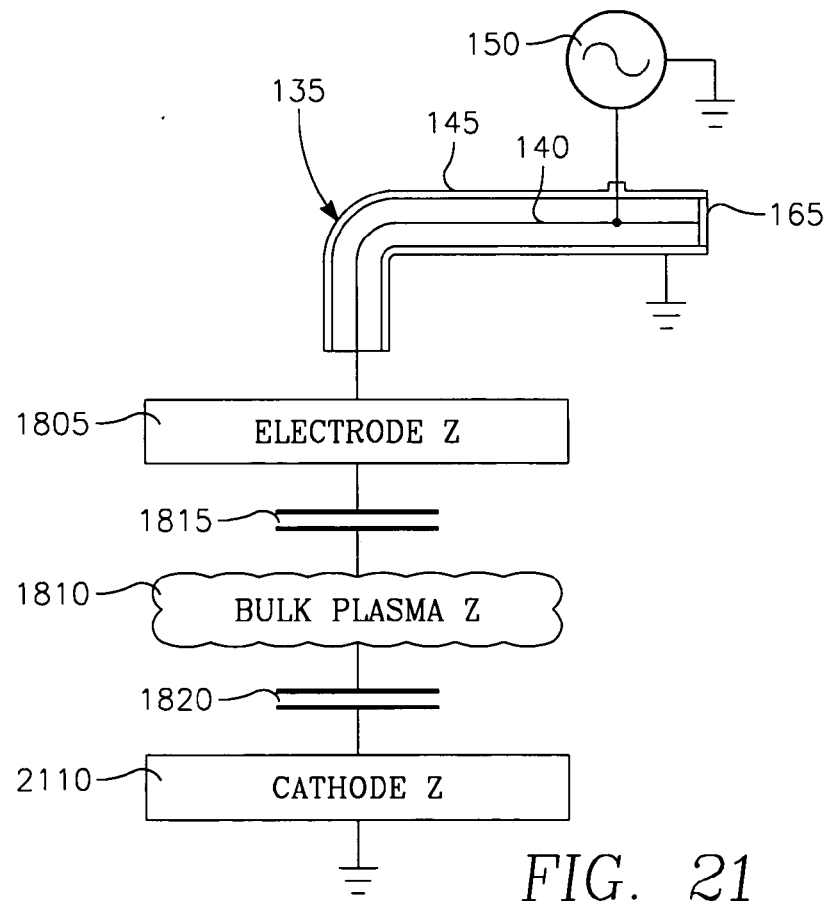
FIG. 21 illustrates an equivalent circuit corresponding to the reactor of FIG. 19.

The magnitude of the cathode impedance was increased by decreasing cathode capacitance. This was achieved by replacing the intermediate insulator layer 5510 (of thickness T1) with a much thicker intermediate insulator layer 5510' (of greater thickness T2), as illustrated in FIG. 19. This increases the displacement between the two plates of the capacitor formed by the cathode 105, namely the conductive mesh 5515 and the grounded metal base 5505, resulting in a proportionate decrease in capacitance and a proportionate increase in impedance. As a result, the cathode 105 of FIG. 19 does not present a short to ground, but rather forms a significant (third) major element in the resonant circuit including the bulk plasma and the overhead electrode 125. FIG. 20 is a simplified schematic diagram of the structure of FIG. 19, having all the elements of the schematic diagram of FIG. 17 but having, in addition, a capacitor 2010 representing the cathode 105, rather than a simple plate shorted to ground as in FIG. 17. FIG. 21 illustrates the equivalent circuit having all the elements of the equivalent circuit of FIG. 18, but having, in addition, a cathode impedance 2110. There are therefore three major elements forming the resonant circuit, namely the electrode impedance 1805, the bulk plasma impedance 1810 and the cathode impedance 2110. The advantage is that the cathode impedance is invariant under changes in chamber pressure, and therefore renders the resonant frequency less susceptible to changes with chamber pressure. In addition, the equivalent circuit of FIG. 21 includes the anode and cathode plasma sheath capacitances 1815, 1820 which are additional elements of resonant circuit. However, the sheath capacitances 1815, 1820 each present a relatively small impedance at 162 MHz compared with the other elements of the resonant circuit, and therefore play a minor role in determining resonant frequency.

The cathode impedance was increased sufficiently (by decreasing its capacitance) to become comparable to the impedance of the overhead electrode. It was also increased sufficiently to be within an order of magnitude of the complex conjugate of the bulk plasma impedance. For example, one working embodiment having a 300 mm diameter cathode employed a bulk plasma impedance of 0.5–j0.3 Ohms (at 162 MHz source power frequency) with an overhead electrode capacitance of about 300 picofarads and a cathode capacitance of about 350 picofarads. This working embodiment worked well over a much greater range of chamber pressures without departing from an impedance match not exceeding a 3:1 SWR. In fact, the desired goal of changing chamber pressure within a range of about 1 to 1000 mT without exceeding an SWR of 3:1 at the VHF generator 150 was realized in this working embodiment. The resonant frequency was near the source power frequency of 162 MHz, and the impedances were as follows: overhead electrode impedance was j4 Ohms, cathode impedance was j4 Ohms, and bulk plasma impedance was 0.5–j0.3 Ohms. The cathode impedance was increased sufficiently to bring it to within a factor of 10 of the bulk plasma impedance and to within less than a factor of 2 of the overhead electrode impedance. In fact, the impedances of the overhead electrode and the cathode were about the same (e.g., to within about 20%). In this way, the impedance of the cathode is increased sufficiently to hold the SWR at the source power generator 150 to 3:1 or less over a chamber pressure range of 1 to 1000 mT and a plasma ion density range of $1 \times 10^{10}$ to $10 \times 10^{10}$ ions/cc.

Figure 22:
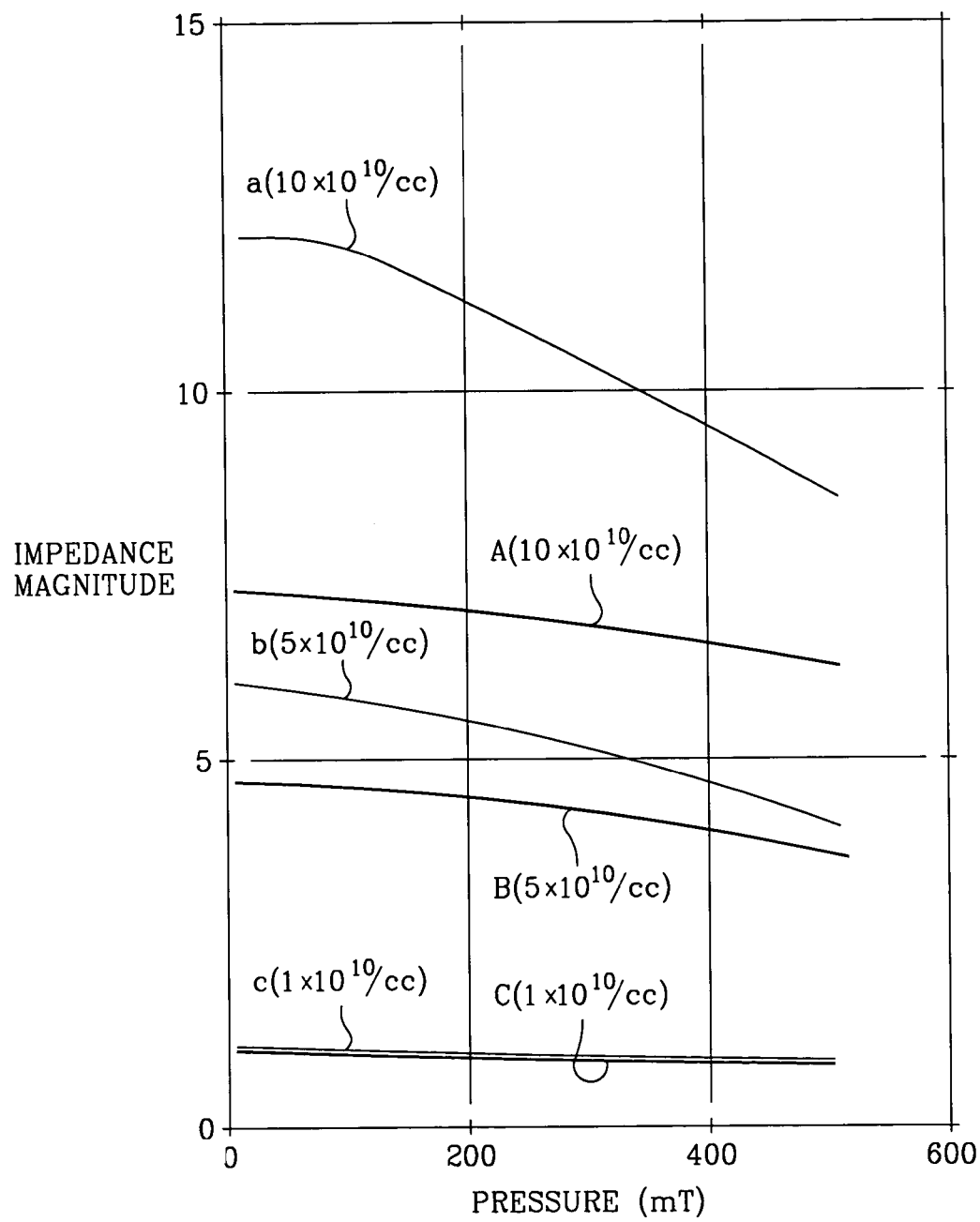
FIG. 22 is a graph comparing the sensitivities to changes in pressure of the reactors of FIGS. 16 and 19 at various plasma ion densities, in which the vertical axis is the magnitude of the impedance at the source power generator output and the horizontal axis is the chamber pressure.

FIG. 22 is a comparative graph illustrating reactor performances with and without the enhanced cathode impedance and modified resonance of the embodiment of FIG. 19. The horizontal axis is the chamber pressure in milliTorr (mT). The vertical axis of FIG. 22 is the impedance magnitude seen by the VHF source power generator 150 normalized to the impedance occurring at 100 mT. Curves labeled a, b and c correspond to the case in which the cathode impedance is virtually zero at the source power frequency at a plasma density of $10\times10^{10}$/cc (curve a), $5\times10^{10}$/cc (curve b) and $1\times10^{10}$/cc (curve c). The worse case (curve a) indicates a dynamic range in impedance excursion of about 25. Curves labeled A, B and C correspond to the case in which the cathode impedance is comparable to the other elements in the resonant circuit (e.g., comparable to the impedance of the overhead electrode 125) at a plasma density of $10\times10^{10}$/cc (curve A), $5\times10^{10}$/cc (curve B) and $1\times10^{10}$/cc (curve C). The curves A, B and C are much flatter than their counterparts (curves a, b and c), and the worse case (curve A) indicates a dynamic range in impedance excursion of only 9.7. This represents a significant reduction of impedance excursion and a corresponding reduction in pressure dependence of the chamber resonance.

Figure 23:
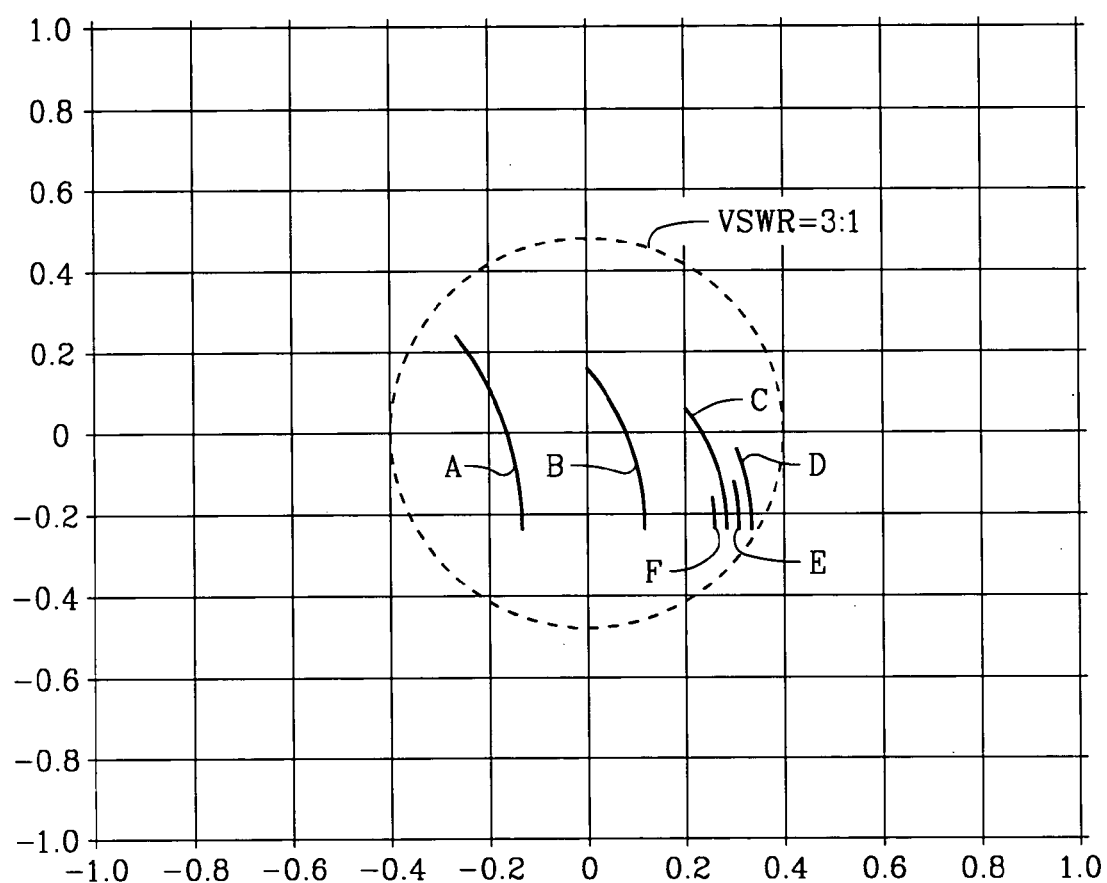
FIG. 23 is a Smith chart illustrating the performance of the reactor of FIG. 19, each curve in the Smith chart depicting the impedance at the source power generator output as pressure is slewed over a predetermined range at a particular plasma ion density, all of the impedances lying within a 3:1 VSWR circle of the Smith chart.

FIG. 23 is a Smith chart of the impedance as pressure is swept from 5 to about 500 mT for different plasma ion densities where the cathode impedance has been enhanced in accordance with the description of FIG. 19. Curves labeled A, B, C, D, E and F represent impedances obtained as the chamber pressure is swept from 5 to 500 mT for densities of, respectively, $1\times10^{10}$/cc, $1.7\times10^{10}$/cc, $2.92\times10^{10}$/cc, $5\times10^{10}$/cc, $7.5\times10^{10}$/cc, and $10\times10^{10}$/cc. Each of these curves is confined within a constant SWR circle of 2:1 on the Smith chart, showing that a large process window for chamber pressure and ion density is achieved in the present invention. These results show that the embodiment of FIG. 19 increases the process window afforded by the fixed impedance match 135 within the 3:1 SWR which the VHF generator 150 can tolerate.

Effect on the Cathode Feedpoint Impedance:

As described above with reference to FIGS. 7–10, the dielectric sleeve assembly 5550 is adjusted to provide a uniform distribution of voltage across the diameter of the cathode 105 for both the RF bias power feed from the bottom and the VHF source power fed from the top. Equivalently, a uniform distribution of capacitance per unit area is provided across the diameter of the cathode 105. This is accomplished by equating the impedance of the peripheral portion of the cathode to the feedpoint impedance at its center for both the RF bias power frequency (an HF frequency) and for the VHF source power frequency. However, the embodiment of FIG. 19 has a higher cathode impedance and therefore a higher feedpoint impedance at the feedpoint 5525a of FIG. 7. This does not change function of the dielectric sleeve assembly 5550, but merely changes the feedpoint impedance to be matched in the peripheral portion of the cathode 150.

Figure 24:
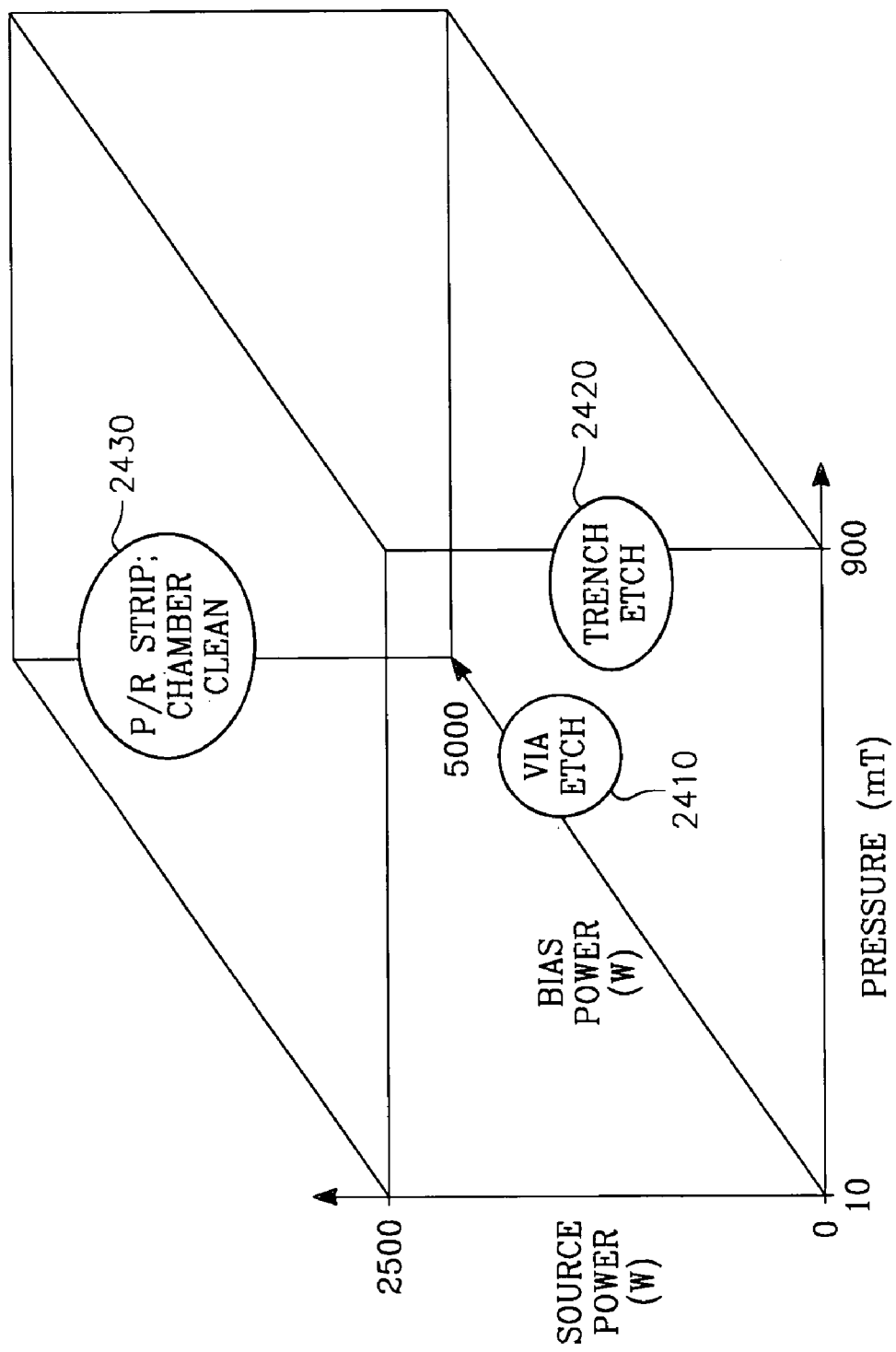
FIG. 24 is a graph illustrating a 3-dimensional process window of the reactor of FIG. 19, in which the X-axis is chamber pressure, the Y-axis is source power and the Z-axis is bias power.

Stable Plasma Maintenance Over Wide Process Window:

The addition of a third reactive element in the resonant circuit (i.e., the cathode impedance) that is invariant under pressure change has been shown in FIGS. 22 and 23 to provide an extremely wide process window having an extremely large pressure range or process window. The impedance match afforded by the coaxial tuning stub 135 (the fixed impedance match element) provides an SWR not exceeding the tolerance of the VHF generator (e.g., typically 3:1) anywhere in this process window, as a result of the addition of the pressure invariant cathode impedance to the resonant circuit. FIG. 24 illustrates the three-dimensional process window volume, in which one axis is pressure that extends from 10 to 900 mT, another axis is source power (determinative of plasma density) extending from 5 to 2500 Watts and the remaining axis is bias power (determinative of ion energy) extending from 5 to 5000 Watts. Different processes are best performed within different sub-volumes within the process window or volume of FIG. 24. A via etch process is best performed in the sub-volume 2410, a trench etch process is best performed in another sub-volume 2420 while a photoresist strip process and a chamber clean process are both performed in a third sub-volume 2430.

In a typical conventional reactor, the impedance match device is incapable of following significant changes in process parameters (source power, bias power, chamber pressure), so that such changes cause an unacceptably high impedance mismatch (an SWR beyond the tolerance of the source power generator), causing the generator to shut down and the plasma to be extinguished. Thus, the plasma must be restarted or re-struck under the changed process conditions (e.g., at a new chamber pressure level), which consumes more time and reduces the productivity of the reactor. Even if the plasma is not extinguished by the process parameter change, the impedance match in such a conventional reactor may not follow the changes, and may not arrive at the target state, i.e., it may converge to the wrong state, so that the desired state (e.g., a particular delivered source power versus reflected source power at a particular chamber pressure and bias power level) may be unattainable without extraordinary efforts.

Figure 25:
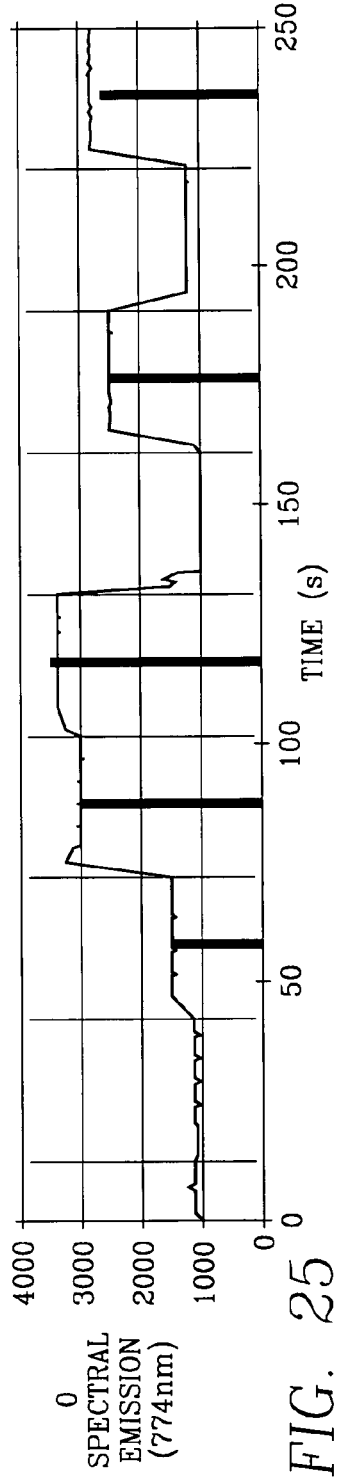
Figure 26:
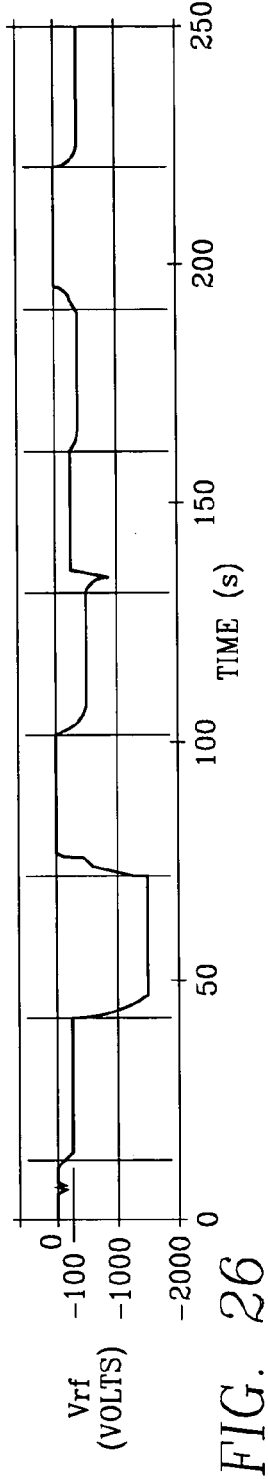
Figure 27:
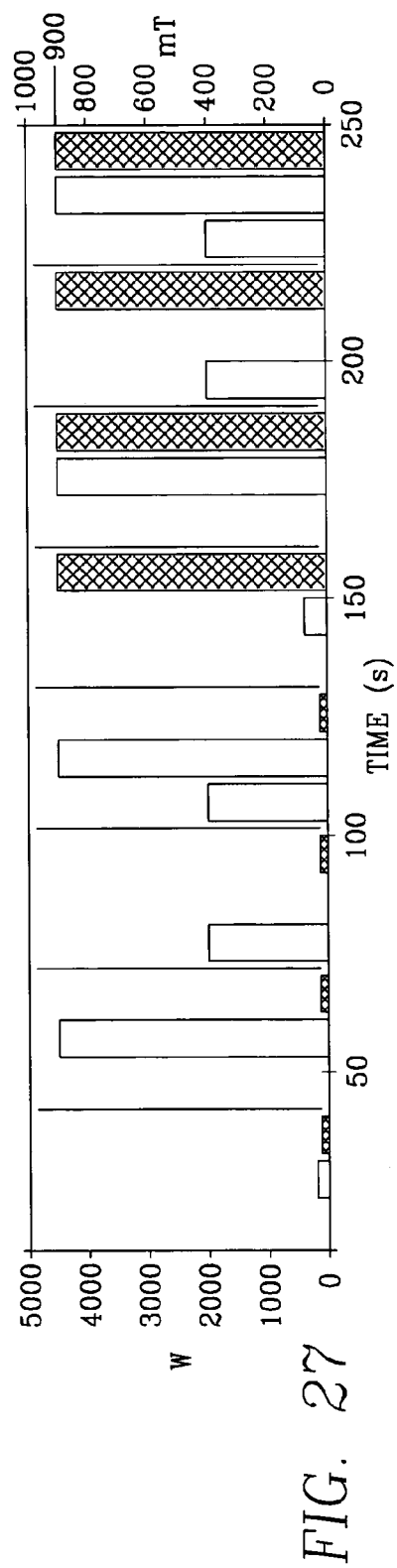

We have found that the fixed impedance match element 135 provides a continuous impedance match while the process parameter (pressure, source power and bias power) are changed to move the process to any location within the volume of FIG. 24. The advantage is that the reactor can be reconfigured to perform different tasks without having to re-ignite the plasma, thus saving vast amounts of process time and cost while greatly increasing productivity and versatility. This feature is illustrated in the contemporaneous timing diagrams of FIGS. 25, 26 and 27. The horizontal axis in each of FIGS. 25, 26 and 27 is a common time axis extending from zero to 250 seconds. The vertical axis of FIG. 25 is a measure of plasma ion density, as indicated by the spectral density of the plasma at 774 nanometers. The vertical axis of FIG. 26 is the measured RF bias voltage. The vertical axis of FIG. 27 is a bar graph depicting the magnitudes of the RF bias power (white bars), the source power (shaded bars) and the chamber pressure (hatched bars) in each one of eight time windows defined along the common time axis of FIGS. 25–27. The magnitude of the source power and bias power is indicated on the left-hand vertical axis of FIG. 27 while the chamber pressure is indicated on the right-hand vertical axis of FIG. 27. The process parameters (source power, bias power and chamber pressure) are adjusted so that during different ones of the eight time windows of FIGS. 25–27, the process resides in a respective one of the eight corners or extrema of the process window of FIG. 24. The plasma density measurement of FIG. 25 shows that the plasma is never extinguished during any of these changes, and therefore never needs to be restarted.

Figure 28:
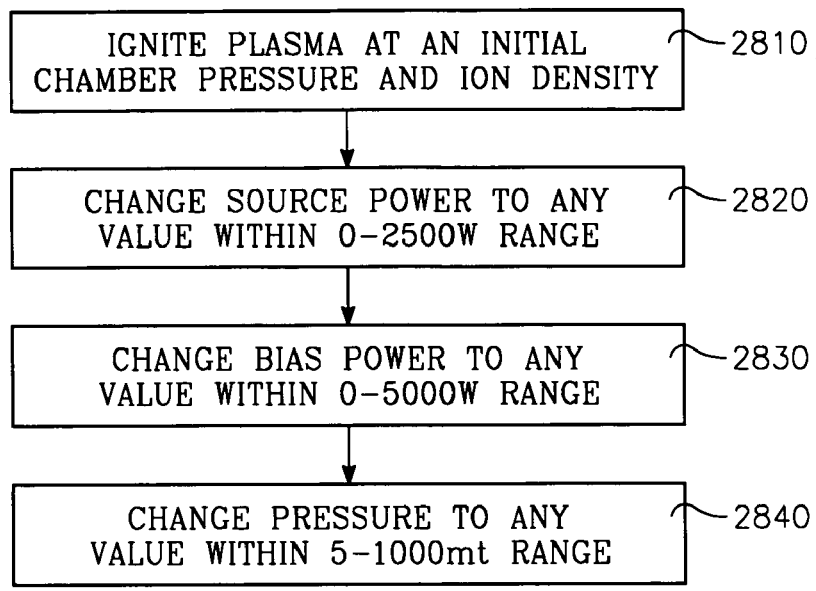
FIG. 28 is a diagram illustrating a method of operating the reactor of FIG. 19 in accordance with the operative sequence of FIG. 27.

This new capability leads to a novel method of operating the plasma reactor illustrated in FIG. 28. Essentially, the method consists of plasma in the chamber once only in any process state within the window or volume of FIG. 24, and then proceeding to change any one or all of the process parameters so as to move the process to any other location within the process window or volume of FIG. 24, all the while maintain the plasma without any re-striking. Thus, in step 2810 of FIG. 28, the plasma is ignited and the reactor is in a first process state corresponding to an initial point in the process volume of FIG. 24. Then, any one or all or some of steps 2820, 2830 and 2840 are performed contemporaneously or successively to slew plasma density by changing the source power (step 2820), to slew ion energy by changing bias power (step 2830) or to change chamber pressure (step 2840) so that the process is moved to one or to a succession of different points in the process volume of FIG. 24. The method of FIG. 28 may allow the reactor to remain at different ones of these points or states for different amounts of time.

Radial Plasma Confinement:

A combination of certain features described above confines the plasma within the cylindrical processing volume overlying the wafer support pedestal 105:

A first feature is the provision of a uniform distribution of impedance (i.e., capacitance) across the surface of the cathode 105 for both the VHF source power current from the VHF generator 150 and simultaneously for the bias power current from the HF bias power generator 200. This is accomplished using the dielectric tuning sleeve assembly 5550 of FIGS. 7–11 and/or the capacitive rings of FIGS. 12–14.

A second feature is the cross-grounding of the source power generator 150 and bias power generator 200, as described above with reference to FIG. 1. In this second feature, the lowest uniform impedance return path to RF ground is through the wafer support pedestal 105 for both the VHF source power and the HF bias power. For the VHF source power return path, this involves the feature of the dielectric sleeve assembly 5550 providing a low impedance across the surface of the wafer support pedestal or cathode 105 for the VHF source power (as described above with reference to FIG. 7). For the HF bias power return, this involves providing through the electrode 125 a minimal impedance to ground at the bias HF frequency. In one example, this was accomplished by shorting the outer end of the coaxial tuning stub 135 with the conductive plate 165, as described above with reference to FIG. 1.

A third feature is the fixed impedance match element (either the tuning stub 135 or equivalently a stripline circuit) to provide an impedance match for the VHF power generator 150 across a wide process window.

The dielectric sleeve assembly 5550 of FIG. 7 plays a role in both the first and second features. For the first feature (uniform distribution of impedance across the cathode surface), the dielectric sleeve assembly 5550 renders the capacitance (or capacitance per unit area) across the surface of the cathode 105 uniform by matching the feedpoint capacitance (at the center or feedpoint 5525*a*) to capacitance of the remainder of the cathode 105 at both the VHF source power frequency and the HF bias power frequency simultaneously, as described above with reference to FIG. 7. For the second feature (low impedance path through the cathode), the dielectric sleeve assembly 5550 tunes the cathode 105 to be an efficient (low loss) receiver at the VHF source power frequency, so that the lowest impedance path to ground for the VHF source power is through the cathode 105. For the HF bias power return path, the overhead electrode is made to be the lowest impedance path by the shorting plate 165 on the outer end 135*a* of the coaxial tuning stub 135.

The features of uniform capacitance distribution across the cathode 105 and low impedance for the VHF source power current through the cathode 105) depend upon maintenance of an adequate impedance match for the VHF source power generator 150 through varying plasma load conditions. This is the function of the fixed impedance match element 135.

Figure 29:
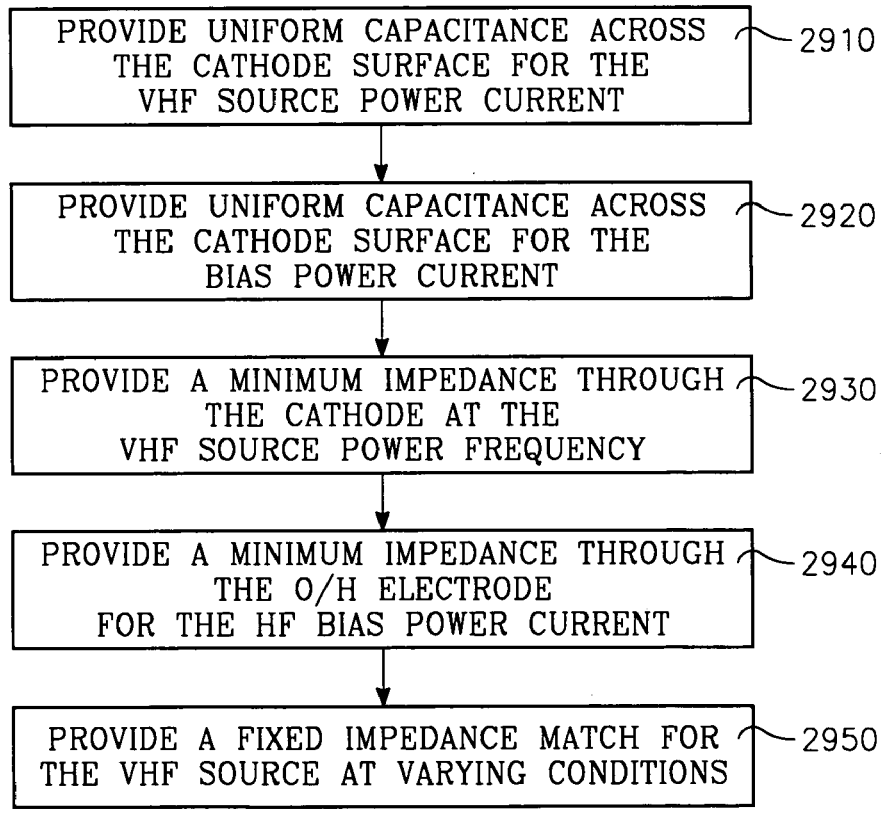
FIG. 29 is a diagram illustrating a method of radially confining the plasma in the reactor of FIG. 19.

The provision of the foregoing features (1, 2, 3) constitutes a method of confining the plasma to the cylindrical process volume overlying the wafer support pedestal or cathode 105 and lying between the cathode 150 and the overhead electrode 125. As illustrated in FIG. 29, a method of confining the plasma to such a cylindrical process volume consists of the following steps: providing a uniform distribution of capacitance across the area of the cathode 105 for the VHF source power current (block 2910); providing a uniform distribution of capacitance across the area of the cathode 105 for the HF bias power current (block 2920); providing a minimum impedance through the cathode 150 at the VHF source power frequency (block 2930); providing a minimum impedance for the HF bias power current through the overhead electrode 125 (block 2940); and, providing a fixed impedance match for the VHF source power generator 150 that maintains an impedance match (e.g., VSWR<3:1) under varying plasma load conditions (block 2950). The result is that the VHF source power current and the HF bias power current flow through the cylindrical process volume between the cathode 105 and the electrode 125, so that the plasma is essentially confined to this volume.

Figure 30:
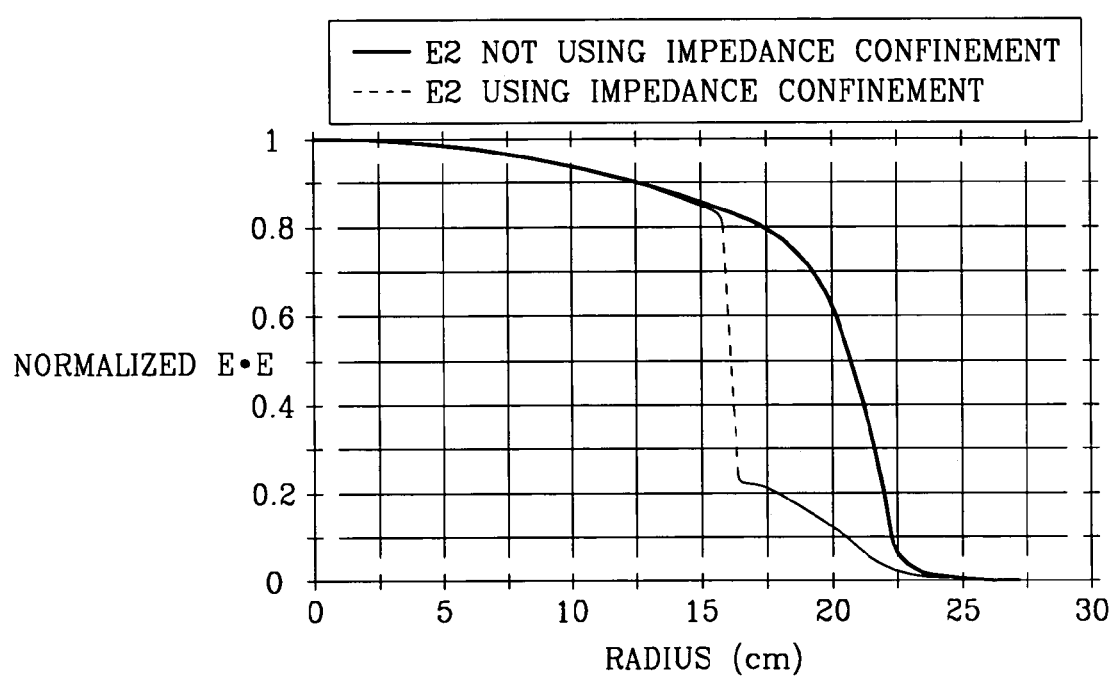
FIG. 30 is a graph comparing radial plasma (electric field) distributions with and without the method of FIG. 29.

In FIG. 30, the results obtained with the features listed in FIG. 29 are compared with results obtained with a plasma reactor lacking that combination of features. Specifically, FIG. 30 illustrates the radial distribution of the square of RF electric field with those features (dashed line curve of FIG. 20) and without the combination of those features (solid line curve of FIG. 30).

The plasma density creation follows the radial distribution of the square of the RF electric field, and therefore the curves of FIG. 30 represent a comparison between radial distributions of plasma densities. The comparison of FIG. 30 shows that without the radial plasma confinement method, the plasma extends well beyond the wafer edge. In contrast, the plasma confinement method causes plasma density to fall off very rapidly at the wafer edge (at about 300 mm diameter) so that the plasma is effectively confined within a cylindrical volume bounded at or near the wafer's circumferential edge. In fact, the plasma density appears to abruptly decrease from about 90% to about 20% of its maximum value at about 1 cm beyond the wafer edge (at a radius of about 16 cm). This 70% decrease occurs within a radial distance less than about 1 cm. The radial plasma confinement is therefore highly effective.

While the invention has been described in detail by specific reference to preferred embodiments, it is understood that variations and modifications thereof may be made without departing from the true spirit and scope of the invention.

What is claimed is:

1. A plasma reactor, comprising:
   a chamber enclosure and a wafer support pedestal within said chamber enclosure;
   an overhead electrode facing said wafer support pedestal and having a capacitance to ground;
   an RF plasma source power generator and a fixed impedance match element coupled to said RF plasma source power generator and to said overhead electrode;
   an RF plasma bias power generator and an impedance match circuit coupled to said RF plasma bias power generator;
   said wafer support pedestal comprising:
   (a) a conductive RF feed layer coupled to said impedance match circuit;
   (b) a grounded base layer;
   (c) a dielectric gap separating said grounded base layer from said conductive RF feed layer to form a capacitor across the dielectric gap, said capacitor having a capacitance to ground that is within an order of magnitude of the capacitance to ground of said overhead electrode.

2. The apparatus of claim 1 wherein said capacitance to ground of said capacitor is within a factor of two of the capacitance to ground of said overhead electrode.

3. A plasma reactor comprising:
a resonant circuit comprising an overhead electrode having a first impedance, a wafer support pedestal having a second impedance and a bulk plasma having a third impedance and generally lying in a process zone between said overhead electrode and said wafer support pedestal, the magnitudes of the impedances of said overhead electrode and said wafer support pedestal being within an order of magnitude of one another, said resonant circuit having a resonant frequency determined by said first, second and third impedances;
an RF plasma source power generator having a frequency at least nearly matching said resonant frequency; and
a fixed impedance match element coupled to said RF plasma source power generator and to said overhead electrode.

4. The apparatus of claim 3 wherein the magnitudes of the impedances of said overhead electrode and said wafer support pedestal are within a factor of two of one another.

5. The plasma reactor of claim 3 wherein said first and second impedances have capacitive reactances and said third impedance has an inductive reactance.

6. The apparatus of claim 3 further comprising a bias power RF generator and an impedance match circuit coupled to said bias power RF generator and to said wafer support pedestal.

7. The apparatus of claim 3 wherein said fixed impedance match element has a resonant frequency at least nearly matching said resonant frequency.

8. The apparatus of claim 3 wherein the impedance of said bulk plasma changes with gas pressure inside said reactor, and wherein said impedance of said wafer support pedestal near said resonant frequency is sufficient to maintain a VSWR at said RF plasma source power generator not exceeding 3:1 for variations in said pressure from 10 mT to 900 mT.

9. The apparatus of claim 6 wherein said wafer support pedestal comprises a conductive RF feed layer and a grounded base layer separated from said conductive RF feed layer across a dielectric gap to form a cathode capacitor across said dielectric gap, the length of said gap being sufficient, in combination with the dielectric constant of said dielectric gap and the area of said wafer support pedestal, to provide a cathode capacitance constituting said second impedance.

10. The apparatus of claim 9 further comprising:
an elongate RF conductor coupled at one end to said impedance match circuit, said conductive RF feed layer having a centrally located feed point coupled to an opposite end of said elongate RF conductor;
a dielectric sleeve assembly coaxially surrounding at least a portion of said elongate RF conductor and having a reactance that renders an impedance at said feedpoint closer to an impedance of a peripheral portion of said RF feed layer at said resonant frequency.

11. The apparatus of claim 10 wherein said dielectric sleeve assembly comprises plural dielectric sleeves coaxial with said elongate RF conductor, said plural sleeves having respective lengths and respective dielectric constants, said respective lengths and dielectric constants being such that said dielectric sleeve assembly brings the impedance of said feedpoint closer to the impedance of said peripheral portion of said conductive RF feed layer at both the frequency of said RF plasma source power generator and at the frequency of said RF plasma bias power generator.

12. The apparatus of claim 11 wherein the impedance of said peripheral portion corresponds to said cathode capacitance.

13. The apparatus of claim 11 wherein:
said fixed impedance match element comprises a coaxial tuning stub having a near end coupled to said overhead electrode and a far end, said tuning stub being shorted at said far end.

14. The apparatus of claim 13 wherein:
the impedance through said tuning stub to ground at the frequency of said RF plasma bias power generator is sufficiently low to render said overhead electrode the lowest impedance path to ground for current from said RF plasma bias power generator; and
the impedance of said feedpoint at the frequency of said RF plasma source power generator is sufficiently low to render said wafer support pedestal the lowest impedance path to ground for current from said RF plasma source power generator.

15. The apparatus of claim 11 wherein said resonant frequency and the frequency of said RF plasma source power generator are VHF frequencies and the frequency of said RF plasma bias power generator is an HF frequency.

16. A plasma reactor comprising:
a resonant circuit comprising an overhead electrode having a first impedance, a wafer support pedestal having a second impedance and a bulk plasma having a third impedance and generally lying in a process zone between said overhead electrode and said wafer support pedestal, said resonant circuit having a resonant frequency determined by said first, second and third impedances;
an RF plasma source power generator having a frequency at least nearly matching said resonant frequency; and
a fixed impedance match element coupled to said RF plasma source power generator and to said overhead electrode,
wherein the impedance of said bulk plasma changes with gas pressure inside said reactor, and wherein said impedance of said wafer support pedestal near said resonant frequency is sufficient to maintain a VSWR at said RF plasma source power generator not exceeding 3:1 for fluctuations in said pressure from 10 mT to 900 mT.

17. A method of operating a plasma reactor, comprising:
providing a resonant circuit comprising an overhead electrode having a first impedance, a wafer support pedestal having a second impedance and a bulk plasma having a third impedance and generally lying in a process zone between said overhead electrode and said wafer support pedestal, said resonant circuit having a resonant frequency determined by said first, second and third impedances;
providing an RF plasma source power generator having a frequency at least nearly matching said resonant frequency; and
providing a fixed impedance match element coupled to said RF plasma source power generator and said overhead electrode.

18. The method of claim 17 further comprising:
setting the impedance of said wafer support pedestal at a level sufficient to maintain a VSWR at said RF plasma source power generator not exceeding 3:1 for changes in said pressure from 10 mT to 900 mT, in said source power generator from about 5 to 2000 Watts and in said bias power generator from about 5 to 2000 Watts;

varying said pressure, said source power generator and said bias power generator within a window of 10 mT to 900 mT, 5 to 2000 Watts of source power and 5 to 2000 Watts of bias power without extinguishing said plasma.

19. In a plasma reactor having a generally cylindrical chamber, a method of radially confining a plasma within a process zone, said method comprising:

providing a resonant circuit comprising an overhead electrode having a first impedance, a wafer support pedestal having a second impedance and a bulk plasma having a third impedance and generally lying in a process zone between said overhead electrode and said wafer support pedestal, said resonant circuit having a resonant frequency determined by said first, second and third impedances;

coupling RF plasma source power at a frequency at least nearly matching said resonant frequency to the overhead electrode through a fixed impedance match element;

coupling RF plasma bias power through an impedance match circuit to the wafer support pedestal;

providing a path to ground in the fixed impedance match element having a sufficiently low impedance at the frequency of said RF plasma bias power to render the overhead electrode a low impedance path to ground for the RF plasma bias power; and providing a uniform impedance across a surface of the wafer support pedestal at the frequencies of both the RF plasma source power and the RF plasma bias power simultaneously, said uniform impedance being sufficiently low at the frequency of the RF plasma source power to render the wafer support pedestal the lowest impedance path to ground for the RF plasma source power.

20. The method of claim 19 wherein the fixed impedance match element comprises a coaxial tuning stub coupled at one end to the overhead electrode, and wherein the step of providing a low impedance path to ground at the bias power frequency comprises providing a short circuit at the opposite end of the coaxial tuning stub.

21. The method of claim 20 wherein:

the step of coupling RF plasma bias power comprises coupling the RF plasma bias power through a central conductor to a feedpoint of a conductive RF feed layer in the wafer support pedestal that is separated from a grounded base layer by a dielectric gap;

the step of providing a uniform impedance across the wafer support pedestal comprises bringing the impedance at the feedpoint closer to an impedance of a peripheral portion of said RF feed layer.

22. The apparatus of claim 21 wherein the step of bringing the impedance at the feedpoint closer to an impedance of the peripheral portion of the wafer support pedestal comprises providing plural dielectric sleeves coaxially surrounding respective portions of the RF conductor, the plural sleeves having respective lengths and respective dielectric constants.

* * * * *